(12) United States Patent
Kim

(10) Patent No.: US 11,294,580 B2
(45) Date of Patent: Apr. 5, 2022

(54) NONVOLATILE MEMORY DEVICE

(71) Applicant: SAMSUNG ELECTRONICS CO., LTD., Suwon-si (KR)

(72) Inventor: Seung-Bum Kim, Hwaseong-si (KR)

(73) Assignee: SAMSUNG ELECTRONICS CO., LTD.

(\*) Notice: Subject to any disclaimer, the term of this patent is extended or adjusted under 35 U.S.C. 154(b) by 0 days.

(21) Appl. No.: 17/033,077

(22) Filed: Sep. 25, 2020

(65) Prior Publication Data

US 2021/0011633 A1 Jan. 14, 2021

Related U.S. Application Data

(63) Continuation-in-part of application No. 16/892,512, filed on Jun. 4, 2020, which is a continuation of (Continued)

(30) Foreign Application Priority Data

Dec. 22, 2017 (KR) .......................... 10-2017-0177848

(51) Int. Cl.
*G06F 3/06* (2006.01)
*G11C 5/14* (2006.01)
(Continued)

(52) U.S. Cl.
CPC .......... *G06F 3/0619* (2013.01); *G06F 3/0604* (2013.01); *G06F 3/0659* (2013.01);
(Continued)

(58) Field of Classification Search
CPC .................................................... G06F 3/0619
See application file for complete search history.

(56) References Cited

U.S. PATENT DOCUMENTS 7,254,668 B1 * 8/2007 Chang ................. G06F 12/0246
711/103
7,315,915 B2 1/2008 Fukuda et al.
(Continued)

OTHER PUBLICATIONS

Search Report of the Intellectual Property Office of Singapore, SG Application No. 10201811112R, dated Jun. 28, 2019, 3 pp.
(Continued)

*Primary Examiner* — Steve N Nguyen
(74) *Attorney, Agent, or Firm* — Myers Bigel, P.A.

(57) ABSTRACT

A nonvolatile memory device includes a memory cell region having a first metal pad and a peripheral circuit region having a second metal pad and vertically connected to the memory cell region by the first metal pad and the second metal pad, a a memory cell array in the memory cell region and an address decoder in the peripheral circuit region. The memory cell array includes memory blocks, and each memory block includes memory cells coupled to word-lines respectively. The word-lines are stacked vertically on a substrate, and some memory cells of the plurality of memory cells are selectable by a sub-block unit smaller than one memory block of the plurality of memory blocks. The address decoder applies an erase voltage to each of sub-blocks in a first memory block of the plurality of memory blocks through the first metal pad and the second metal pad.

12 Claims, 32 Drawing Sheets

Related U.S. Application Data application No. 16/111,813, filed on Aug. 24, 2018, now Pat. No. 10,712,954.

(51) Int. Cl.

| | | |
|---|---|---|
| *H01L 27/1157* | (2017.01) | |
| *H01L 27/11565* | (2017.01) | |
| *G06F 11/10* | (2006.01) | |
| *G11C 11/56* | (2006.01) | |
| *G11C 16/04* | (2006.01) | |
| *G11C 16/08* | (2006.01) | |
| *G11C 16/10* | (2006.01) | |
| *G11C 16/14* | (2006.01) | |
| *G11C 16/26* | (2006.01) | |
| *G11C 29/52* | (2006.01) | |
| *G11C 16/30* | (2006.01) | |
| *H01L 27/11582* | (2017.01) | |
| *G11C 29/04* | (2006.01) | |
| *G11C 29/12* | (2006.01) | |

(52) U.S. Cl.
CPC ........ *G06F 3/0679* (2013.01); *G06F 11/1068* (2013.01); *G11C 5/143* (2013.01); *G11C 11/5671* (2013.01); *G11C 16/0483* (2013.01); *G11C 16/08* (2013.01); *G11C 16/10* (2013.01); *G11C 16/14* (2013.01); *G11C 16/26* (2013.01); *G11C 16/30* (2013.01); *G11C 29/52* (2013.01); *H01L 27/1157* (2013.01); *H01L 27/11565* (2013.01); *G11C 2029/0409* (2013.01); *G11C 2029/1206* (2013.01); *H01L 27/11582* (2013.01)

(56) References Cited

U.S. PATENT DOCUMENTS

| | | |
|---|---|---|
| 8,537,615 B2 | 9/2013 | Maeda |
| 8,769,374 B2 | 7/2014 | Franceschini et al. |
| 8,787,088 B2 | 7/2014 | Dutta et al. |
| 8,788,910 B1 | 7/2014 | Northcott |
| 8,837,228 B2 | 9/2014 | Nam et al. |
| 8,909,493 B2 | 12/2014 | Avila et al. |
| 9,015,561 B1 | 4/2015 | Hu |
| 9,299,439 B2 | 3/2016 | Ghodsi |
| 9,355,724 B2 | 5/2016 | Oh et al. |
| 9,362,003 B2 | 6/2016 | D'Abreu et al. |
| 9,530,517 B2 | 12/2016 | Lee et al. |
| 9,564,233 B1 | 2/2017 | Cho et al. |
| 2006/0002190 A1 | 1/2006 | Roohparvar |
| 2008/0219053 A1* | 9/2008 | Kim ................... G11C 16/3418 365/185.11 |
| 2009/0193221 A1* | 7/2009 | Reid ................... G06F 12/0246 711/202 |
| 2011/0138103 A1* | 6/2011 | Iliadis ................. G06F 12/0246 711/103 |
| 2011/0157981 A1 | 6/2011 | Sharon et al. |
| 2012/0314499 A1 | 12/2012 | Yuan et al. |
| 2013/0028022 A1* | 1/2013 | Vali ..................... G11C 16/3436 365/185.18 |
| 2013/0107628 A1* | 5/2013 | Dong .................... G11C 16/14 365/185.17 |
| 2013/0205076 A1 | 8/2013 | Schuette et al. |
| 2013/0229872 A1 | 9/2013 | Kim |
| 2013/0294168 A1 | 11/2013 | Shirakawa |
| 2014/0063938 A1* | 3/2014 | Oh ..................... H01L 27/11556 365/185.02 |
| 2014/0189284 A1* | 7/2014 | Hyuseinova ........ G06F 12/0238 711/206 |
| 2014/0269090 A1 | 9/2014 | Flynn et al. |
| 2014/0369124 A1 | 12/2014 | Moon et al. |
| 2014/0372678 A1* | 12/2014 | Moon ................. G06F 12/0246 711/103 |
| 2015/0135025 A1* | 5/2015 | Kim .................... G06F 12/0246 714/704 |
| 2015/0138885 A1 | 5/2015 | Iwai et al. |
| 2015/0186065 A1 | 7/2015 | Seo |
| 2016/0162185 A1 | 6/2016 | D'Abreu et al. |
| 2016/0170682 A1* | 6/2016 | Bakshi ................. G06F 3/0647 711/103 |
| 2016/0266955 A1 | 9/2016 | Takeda et al. |
| 2017/0132125 A1 | 5/2017 | Cai et al. |

OTHER PUBLICATIONS

Examination report under sections 12 & 13 of the Patents Act, 1970 and the Patents Rules, 2003, IN Application No. 201824035283, dated Jun. 30, 2020, 6 pp.

\* cited by examiner

N < M

Vwe1 < Vwe2 < VERS

Vwe1 < VERS

Vwe1 < VERS1 < VERS2

VRPASS12 < VRPASS11

VRPASS22 < VRPASS21

NONVOLATILE MEMORY DEVICE

CROSS-REFERENCE TO RELATED APPLICATIONS

This U.S. non-provisional patent application is a continuation-in-part application of U.S. application Ser. No. 16/892,512 filed on Jun. 4, 2020, which is a Continuation of U.S. patent application Ser. No. 16/111,813, filed on Aug. 24, 2018, now allowed, U.S. Pat. No. 10,712,954, which itself claims priority under 35 USC § 119 to Korean Patent Application No. 10-2017-0177848, filed on Dec. 22, 2017, in the Korean Intellectual Property Office (KIPO), the disclosure of which is incorporated herein in its entirety by reference.

BACKGROUND

Some embodiments relate generally to memory devices, and more particularly to nonvolatile memory devices, methods of operating nonvolatile memory devices and storage devices including the same.

Semiconductor memory devices may be volatile or nonvolatile. Flash memory devices are typically nonvolatile semiconductor memory devices. Flash memory devices may be used as a voice and image data storing medium for information appliances, such as a computer, a cellular phone, a PDA, a digital camera, a handheld PC, and the like.

Nonvolatile memory devices having memory cells that are stacked in three dimensions have been researched to improve integrity of the nonvolatile memory devices. However, increases in storage capacity may cause various problems that do not match existing memory management policies.

SUMMARY

According to some embodiments, a nonvolatile memory device includes a memory block, a plurality of intermediate switching transistors and a control circuit. The memory block includes at least a first stack and a second stack in a vertical direction. The memory block includes a plurality of cell strings, and each cell string includes a plurality of memory cells connected in series in the vertical direction between a source line and each of a plurality of bit-lines. Some memory cells of the plurality of memory cells are selectable by a sub-block unit smaller than the memory block. The plurality of intermediate switching transistors are coupled to an intermediate gate line and in a boundary portion between the first stack and the second stack in the vertical direction, sub-blocks of the memory block includes a first group including a first sub-block and a second sub-block which include memory cells coupled to word-lines in the first stack, a second group including a third sub-block and a fourth sub-block which include memory cells coupled to word-lines in the second stack and an intermediate sub-block includes memory cells coupled to word-lines adjacent to the intermediate gate line. The control circuit applies respective program/erase cycles of respective durations to the first group, the second group, and the intermediate sub-block based on an address.

According to some embodiments, a memory system includes a nonvolatile memory device and a memory controller to control the nonvolatile memory device. The nonvolatile memory device includes a memory cell array and a plurality of intermediate switching transistors. The memory cell array includes a plurality of memory blocks, a first memory block of the plurality of memory blocks includes at least a first stack and a second stack in a vertical direction, the first memory block includes a plurality of cell strings, and each cell string includes a plurality of memory cells connected in series in the vertical direction between a source line and each of a plurality of bit-lines. Some memory cells of the plurality of memory cells are selectable by a sub-block unit smaller than one memory block of the plurality of memory blocks. The plurality of intermediate switching transistors are coupled to an intermediate gate line and in a boundary portion between the first stack and the second stack in the vertical direction, sub-blocks of the memory block includes a first group including a first sub-block and a second sub-block which include memory cells coupled to word-lines in the first stack, a second group including a third sub-block and a fourth sub-block which include memory cells coupled to word-lines in the second stack and an intermediate sub-block includes memory cells coupled to word-lines adjacent to the intermediate gate line. The memory controller applies respective program/erase cycles of respective durations to the first group, the second group and the intermediate sub-block using a command and address to be applied to the nonvolatile memory device.

According to some embodiments, a nonvolatile memory device includes a memory cell region having a first metal pad and a peripheral circuit region having a second metal pad and vertically connected to the memory cell region by the first metal pad and the second metal pad, a a memory cell array in the memory cell region and an address decoder in the peripheral circuit region. The memory cell array includes a plurality of memory blocks, and each of the plurality of memory blocks includes a plurality of memory cells coupled to word-lines respectively. The word-lines are stacked vertically on a substrate, and some memory cells of the plurality of memory cells are selectable by a sub-block unit smaller than one memory block of the plurality of memory blocks. The address decoder applies an erase voltage to each of sub-blocks in a first memory block of the plurality of memory blocks through the first metal pad and the second metal pad.

Accordingly, the nonvolatile memory device may divide sub-blocks of a first memory block into at least one bad sub-block and at least one normal sub-block based on error occurrence frequency of each of the sub-blocks or based on endurance characteristic due to positions of the sub-blocks, may apply different program/erase cycles to the at least one bad sub-block and the at least one normal sub-block and may apply adjust bias condition to the first memory block during a memory operation of the first memory block. Therefore, the nonvolatile memory device may enhance performance and prevent reduction of a lifetime of the nonvolatile memory device.

BRIEF DESCRIPTION OF THE DRAWINGS

Illustrative, non-limiting example embodiments will be more clearly understood from the following detailed description in conjunction with the accompanying drawings.

DETAILED DESCRIPTION

Figure 1:
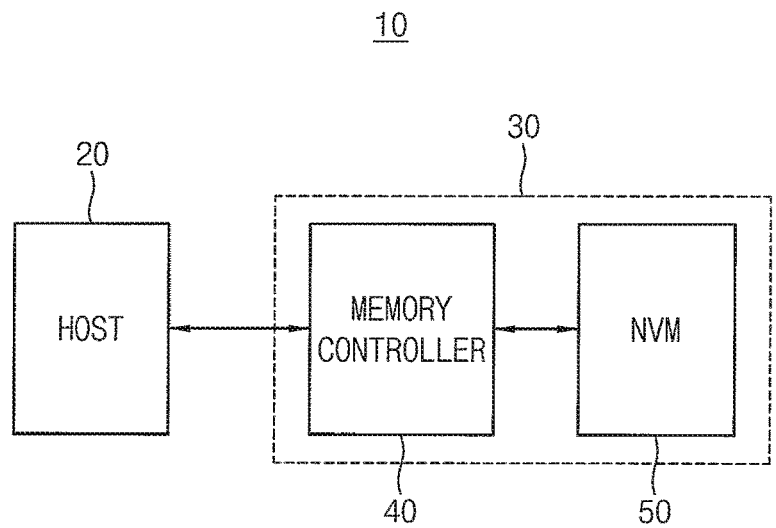
FIG. 1 is a block diagram illustrating an electronic device according to example embodiments of the present inventive concept.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

Various some embodiments will be described more fully hereinafter with reference to the accompanying drawings, in which some embodiments are shown.

The embodiments are described, and illustrated in the drawings, in terms of functional blocks, units and/or modules. These blocks, units and/or modules may be physically implemented by electronic (or optical) circuits such as logic circuits, discrete components, microprocessors, hard-wired circuits, memory elements, wiring connections, and the like, which may be formed together in a single integrated circuit (e.g., as a single semiconductor chip) or as separate integrated circuits and/or discrete components (e.g., several semiconductor chips wired together on a printed circuit board) using semiconductor fabrication techniques and/or other manufacturing technologies. These blocks, units and/ or modules may be implemented by a processor (e.g., a microprocessor, a controller, a CPU, a GPU) or processors that are programmed using software (e.g., microcode) to perform various functions discussed herein. Each block, unit and/or module may be implemented by dedicated hardware, or as a combination of dedicated hardware to perform some functions and a processor to perform other functions. Also, each block, unit and/or module of the embodiments may be embodied by physically separate circuits and need not be formed as a single integrated. As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram illustrating an electronic device according to some embodiments.

Referring to FIG. 1, an electronic device 10 may include a host 20 and a storage device (or, a memory system) 30. The storage device 30 may include a memory controller 40 and at least one nonvolatile memory device 50. The host 20 may control overall operation of the storage device 30.

The memory controller 40 may exchange the signals such as a command, an address, data, etc. with the host 20. The memory controller 40 may write data in the nonvolatile memory device 50 and reads data from the nonvolatile memory device 50 according to a command from the host 20.

Figure 2:
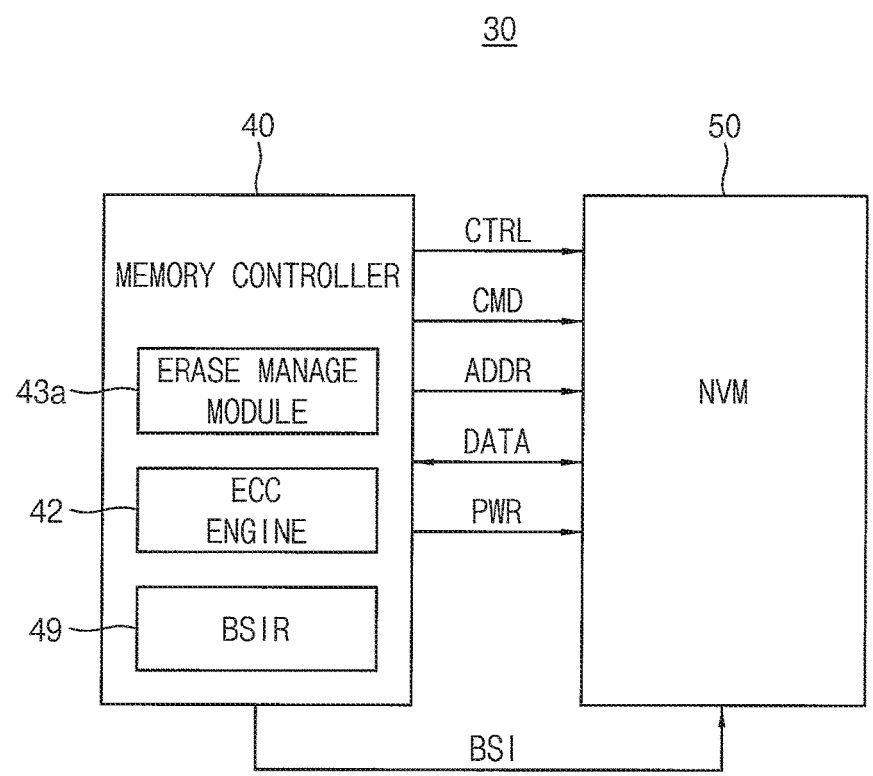
FIG. 2 is a block diagram illustrating the storage device in FIG. 1 according to example embodiments of the present inventive concept.

FIG. 2 is a block diagram illustrating the storage device in FIG. 1 according to some embodiments.

Referring to FIG. 2, the storage device 30 may include the memory controller 40 and the at least one nonvolatile memory device 50.

In some embodiments, each of the memory controller 40 and the nonvolatile memory device 50 may be provided in the form of a chip, a package, or a module. In some embodiments, the memory controller 40 and the nonvolatile memory device 50 may be mounted on various packages to be provided as a storage device such as a memory card.

The nonvolatile memory device 50 may perform a read operation, an erase operation, a program operation or a write operation under control of the memory controller 40. The nonvolatile memory device 50 receives a command CMD, an address ADDR and data DATA through input/output lines from the memory controller 40 for performing such operations. In addition, the nonvolatile memory device 50 receives a control signal CTRL through a control line from the memory controller 40. In addition, the nonvolatile memory device 50 receives a power PWR through a power line from the memory controller 40.

Memory cells of the nonvolatile memory device 50 may have the physical characteristic that a threshold voltage distribution varies due to causes, such as a program elapsed time, a temperature change or reading, program disturbance, read disturbance, etc. For example, data stored at the nonvolatile memory device 50 may become erroneous due to the above causes. The memory controller 40 may utilize a variety of error correction techniques to correct such errors. For example, the memory controller 40 may include an error correction code (ECC) engine 42.

The memory controller 40 may perform an erase operation on the nonvolatile memory device 50 by sub-block unit and the sub-block is smaller than one memory block of the nonvolatile memory device 50. As an example, one memory block may include a plurality of sub-blocks. The memory controller 40 may include an erase manage module 43a to manage the erase operation by sub-block unit.

After a sub-block erase operation, the erase manage module 43a may check an erase status of an erased sub-block and/or a sub-block adjacent to the erased sub-block. For example, the erase manage module 43a may sense memory cells of the erased sub-block to determine whether specific parameters exceed a reference cycle value. The erase manage module 43a may read data of sub-block(s) adjacent to the erased sub-block to detect erase-inhibition efficiency. For example, the erase manage module 43a may detect bit error rate (BER) based on data read from an erased sub-block. The erase manage module 43a may acquire and monitor wear-leveling information (e.g., erase count) on the erased sub-block. In addition, the erase manage module 43a may read data of the erased sub-block to monitor a variation in threshold voltages of selected memory cells and/or a variation in the bit error rate (BER). The erase manage module 43a may also read data of an unselected sub-block to detect a variation in a threshold voltage. The memory controller 40 may perform various procedures for compensating for insufficient erasing of a selected sub-block based on erase status information detected by the erase manage module 43a.

Generally, a memory block may be a maximum size of a memory unit that may be erased at the same time. In a three-dimensional nonvolatile memory device, where word-lines are stacked in a direction intersecting (e.g., perpendicular to) a substrate, a memory block may be defined as a group of cell strings sharing stacked word-lines. A sub-block may correspond to a sub-memory unit defined by dividing the memory block (or, physical block) by word line unit or selection line unit. For example, each sub-block may be formed of memory cells sharing a portion of the word-lines of the memory block.

During a read operation on the nonvolatile memory device 50, the memory controller 40 may read data stored at a first page of the nonvolatile memory device 50, using a default read voltage set. The default read voltage set may include predetermined read voltages. The ECC engine 42 may detect and correct errors included in data read from the nonvolatile memory device 50. The ECC engine 42 may perform an ECC operation by detecting and correcting errors. In some embodiments, the ECC engine 42 may be implemented in the form of hardware. The ECC engine 42 may determine error occurrence frequency in the read data from the nonvolatile memory device 50 by unit of sub-block and may designate a sub-block as a bad sub-block, whose error occurrence frequency is greater than a reference cycle value during a predetermined time.

The memory controller 40 may include a bad sub-block information register 49 that stores information of at least one bad sub-block of the sub-blocks and may provide the nonvolatile memory device 50 with bad sub-block information including bad sub-block addresses of the bad sub-block.

Figure 3:
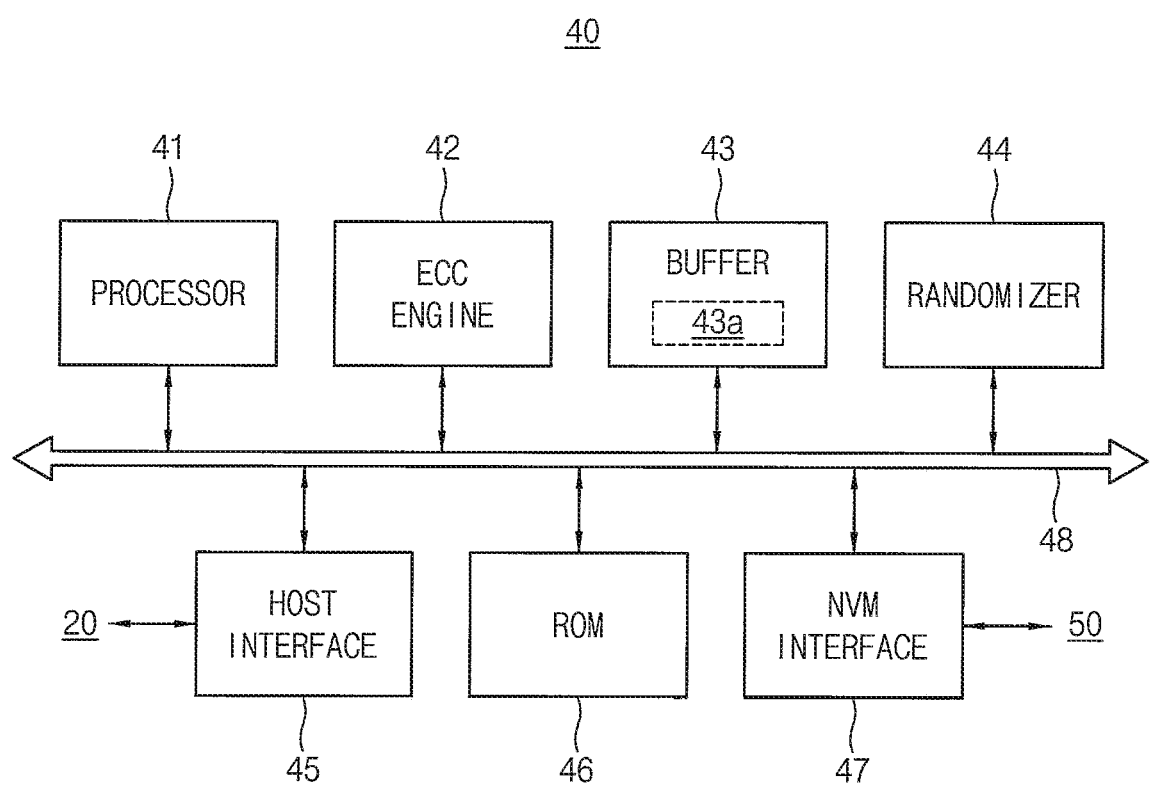
FIG. 3 is a block diagram illustrating the memory controller in the storage device of FIG. 2 according to example embodiments of the present inventive concept.

FIG. 3 is a block diagram illustrating the memory controller in the storage device of FIG. 2 according to some embodiments.

Referring to FIGS. 2 and 3, the memory controller 40 may include a processor 41, the ECC engine 42, the buffer 43, the erase manage module 43a that may be associated with the buffer 43, a randomizer 44, a host interface 45, a read only memory (ROM) 46, and a nonvolatile memory interface 47 which are connected via a bus 48. The ECC engine 42, and the erase manage module 43a are described with reference to FIG. 2, and a description thereof is thus omitted.

The processor 41 controls an overall operation of the memory controller 40. In some embodiments, the erase manage module 43a may be implemented in software and stored in the buffer 43. The erase manage module 43a stored in the buffer 43 may be driven by the processor 41. The ROM 46 may store a variety of information needed for the memory controller 40 to operate, in firmware. The buffer 43 may store data provided from the nonvolatile memory device 50 and may include the erase manage module 43a.

The randomizer 44 may randomize data to be stored in the nonvolatile memory device 50. For example, the randomizer 44 may randomize data to be stored in the nonvolatile memory device 50 in a unit of a word-line.

Data randomizing may be performed to process data such that program states of memory cells connected to a word-line have the same ratio. For example, if memory cells connected to one word-line are multi-level cells (MLC) each storing 2-bit data, each of the memory cells has one of an erase state and first through third program states. In this case, the randomizer 44 randomizes data such that in memory cells connected to one word-line, the number of memory cells having the erase state, the number of memory cells having the first program state, the number of memory cells having the second program state, and the number of memory cells having the third program state are substantially the same as one another. For example, memory cells in which randomized data is stored have program states of which the number is equal to one another. The randomizer 44 de-randomizes data read from the nonvolatile memory device 50. It will be understood that, although the terms first, second, third, etc. may be used herein to describe various elements, elements should not be limited by these terms; rather, these terms are only used to distinguish one element from another element. Thus, a first element discussed below could be termed a second element without departing from the scope of the present inventive concepts.

The randomizer 44 may randomize page data. For the sake of easy understanding, an ideal operation of the randomizer 44 is described. However, the inventive concept is not limited thereto. For example, the randomizer 44 randomizes data such that in memory cells connected to one word-line, the number of memory cells having the erase state, the number of memory cells having the first program state, the number of memory cells having the second program state, and the number of memory cells having the third program state are approximately the same value. For example, memory cells in which randomized data is stored have program states of which the number is similar to one another.

The memory controller 40 communicates with the host 20 through the host interface 45. For example, the host interface 45 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Nonvolatile memory express (NVMe), Universal Flash Storage (UFS), and etc. The memory controller 40 communicates with the nonvolatile memory device 50 through the nonvolatile memory interface 47.

Figure 4:
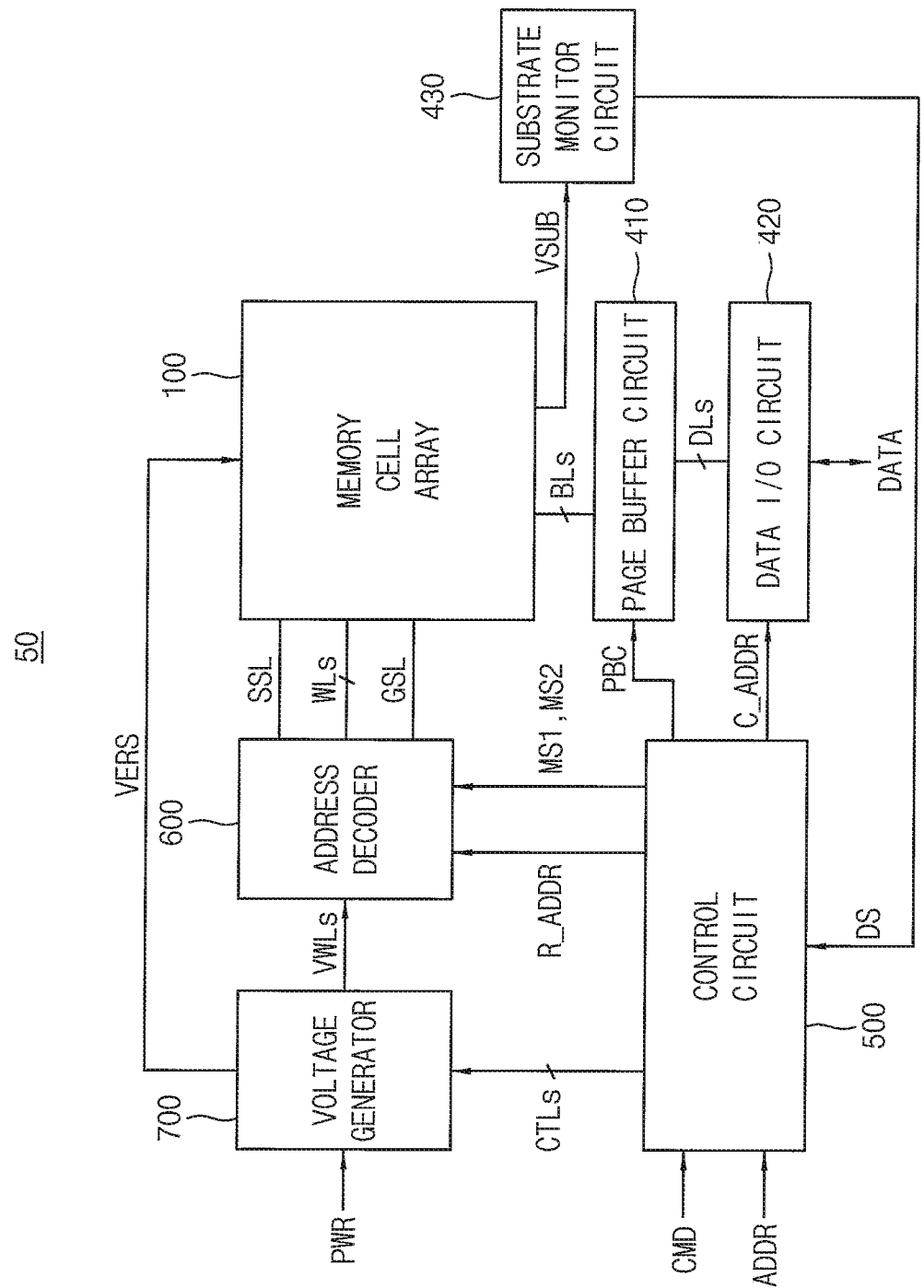
FIG. 4 is a block diagram illustrating the nonvolatile memory device in the storage device of FIG. 2 according to example embodiments of the present inventive concept.

FIG. 4 is a block diagram illustrating the nonvolatile memory device in the storage device of FIG. 2 according to some embodiments.

Referring to FIG. 4, the nonvolatile memory device 50 includes a memory cell array 100, an address decoder 600, a page buffer circuit 410, a data input/output circuit 420, a substrate monitor circuit 430, a control circuit 500 and a voltage generator 700.

The memory cell array 100 may be coupled to the address decoder 600 through a string selection line SSL, a plurality of word-lines WLs, and/or a ground selection line GSL. In addition, the memory cell array 100 may be coupled to the page buffer circuit 410 through a plurality of bit-lines BLs. The memory cell array 100 may include a plurality of memory cells coupled to the plurality of word-lines WLs and the plurality of bit-lines BLs.

The address decoder 600 may transfer voltages to the string selection line SSL, the plurality of word-lines WLs, and/or the ground selection line GSL for operating memory cells of the memory cell array 100 in response to an address ADDR and a command CMD received from the memory controller 40 by receiving various word-line voltages VWLs from the voltage generator 700. The voltage generator 700 may provide the word-line voltages VWLs to the address decoder 600 and an erase voltage VERS to the memory cell array 100 in response to control signals CTLs received from the control circuit 500.

Figure 5:
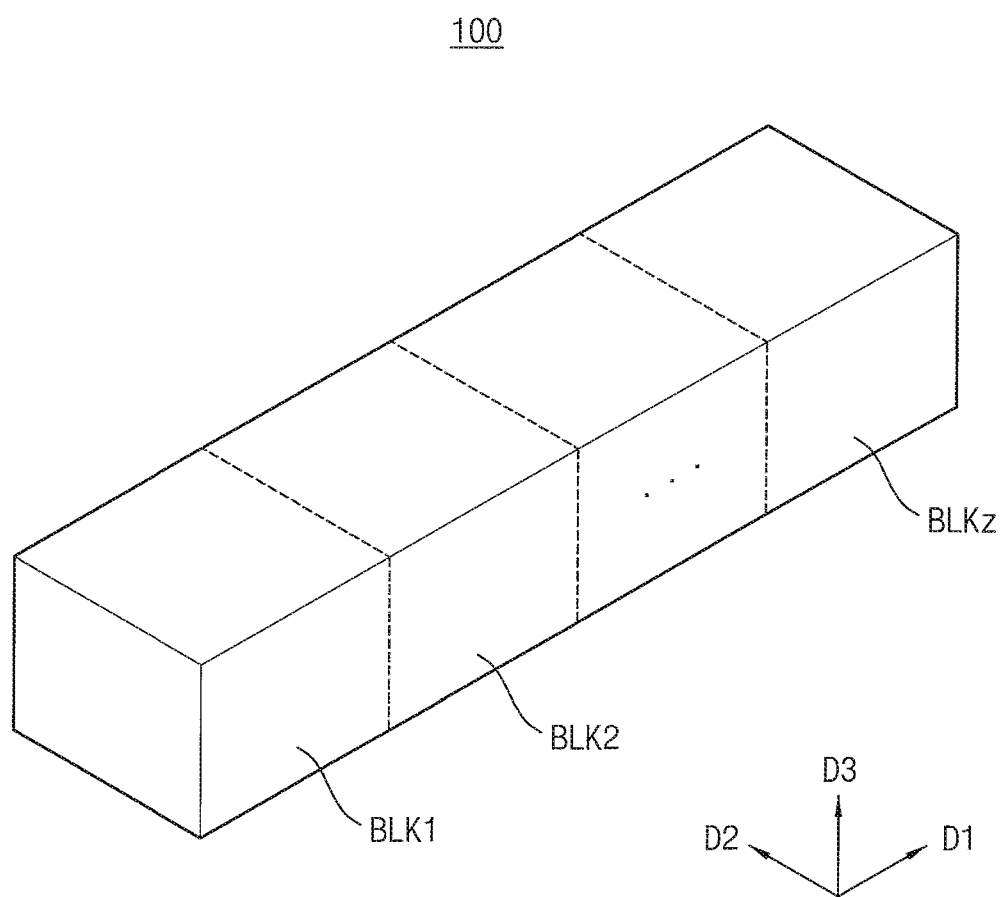
FIG. 5 is a block diagram illustrating the memory cell array in FIG. 4 according to example embodiments of the present inventive concept.

FIG. 5 is a block diagram illustrating the memory cell array in FIG. 4 according to some embodiments.

Referring to FIG. 5, the memory cell array 100 may include a plurality of memory blocks BLK1 to BLKz that extend in first through third directions D1, D2 and D3. In an embodiment, the memory blocks BLK1 to BLKz are selected by the address decoder 600 in FIG. 4. For example, the address decoder 600 may select a memory block BLK corresponding to a block address among the memory blocks BLK1 to BLKz. The address decoder 600 may select at least one sub-block in one memory block in response to a row address R_ADDR.

Figure 6:
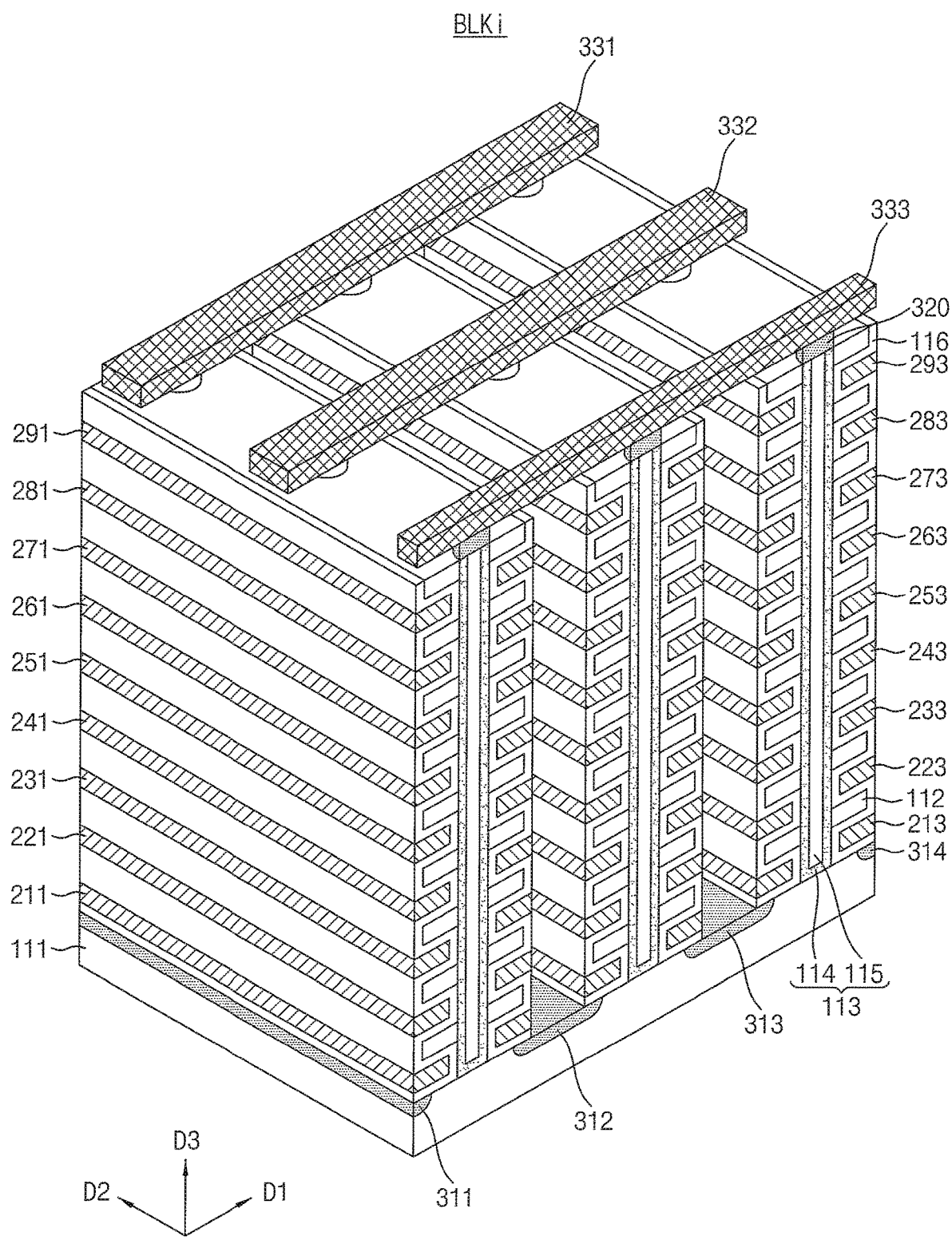
FIG. 6 is a perspective view illustrating one of the memory blocks of FIG. 5 according to example embodiments of the present inventive concept.

FIG. 6 is a perspective view illustrating one of the memory blocks of FIG. 5 according to some embodiments.

Referring to FIG. 6, a memory block BLKa includes structures extending along the first to third directions D1~D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In an embodiment, the substrate 111 has a p-type well (or a p-type pocket well). However, the conductive type of the substrate 111 is not limited to the p-type.

A plurality of doping regions 311 to 314 extending along the first direction D1 are provided in/on the substrate 111. For example, the plurality of doping regions 311 to 314 may have a second type (e.g., a second conductive type) different from the first type of the substrate 111. In some embodiments, the first to fourth doping regions 311 to 314 have an n-type. However, the conductive type of the first to fourth doping regions 311 to 314 is not limited to the n-type.

A plurality of insulation materials 112 extending along the second direction D2 are sequentially provided along the third direction D3 on a region of the substrate 111 between the first and second doping regions 311 and 312. For example, the plurality of insulation materials 112 are provided along the third direction D3, being spaced by a specific distance. For example, the insulation materials 112 may include an insulation material such as an oxide layer.

A plurality of pillars 113 penetrating the insulation materials along the third direction D3 are sequentially disposed along the second direction D2 on a region of the substrate 111 between the first and second doping regions 311 and 312. For example, the plurality of pillars 113 penetrates the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In some embodiments, the channel layer 114 of each pillar 113 may include a p-type silicon. However, the channel layer 114 of each pillar 113 is not limited to the p-type silicon.

An inner material 115 of each pillar 113 includes an insulation material. For example, the inner material 115 of each pillar 113 may include an insulation material such as a silicon oxide. For example, the inner material 115 of each pillar 113 may include an air gap.

An insulation layer 116 is provided along the exposed surfaces of the insulation materials 112, the pillars 113, and the substrate 111, on a region between the first and second doping regions 311 and 312. For example, the insulation layer 116 provided on the exposed surface in the third direction D3 of the last insulation material 112 may be removed.

A plurality of first conductive materials 211 to 291 is provided between second doping regions 311 and 312 on the exposed surfaces of the insulation layer 116. For example, the first conductive material 211 extending along the second direction D2 is provided between the substrate 111 and the insulation material 112 adjacent to the substrate 111.

A first conductive material extending along the first direction D1 is provided between the insulation layer 116 at the top of a specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The plurality of first conductive materials 211 to 291 may include a metal material. The plurality of first conductive materials 211 to 291 may include a conductive material such as a polysilicon.

Similar structures as those on the first and second doping regions 311 and 312 may be provided in a region between the second and third doping regions 312 and 313. In the region between the second and third doping regions 312 and 313, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of third conductive materials 213 to 293 extending along the first direction D1.

In a region between the third and fourth doping regions 313 and 314, similar structures as those on the first and second doping regions 311 and 312 may be provided. In the region between the third and fourth doping regions 313 and 314, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of third conductive materials 213 to 293 extending along the first direction D1.

Drains 320 are provided on the plurality of pillars 113, respectively. On the drains, the second conductive materials 331 to 333 extending along the first direction D1 are provided. The second conductive materials 331 to 333 are disposed along the second direction D2, being spaced by a specific distance. The second conductive materials 331 to 333 are respectively connected to the drains 320 in a corresponding region. The drains 320 and the second conductive material 333 extending along the first direction D1 may be connected through respective contact plugs.

Figure 7:
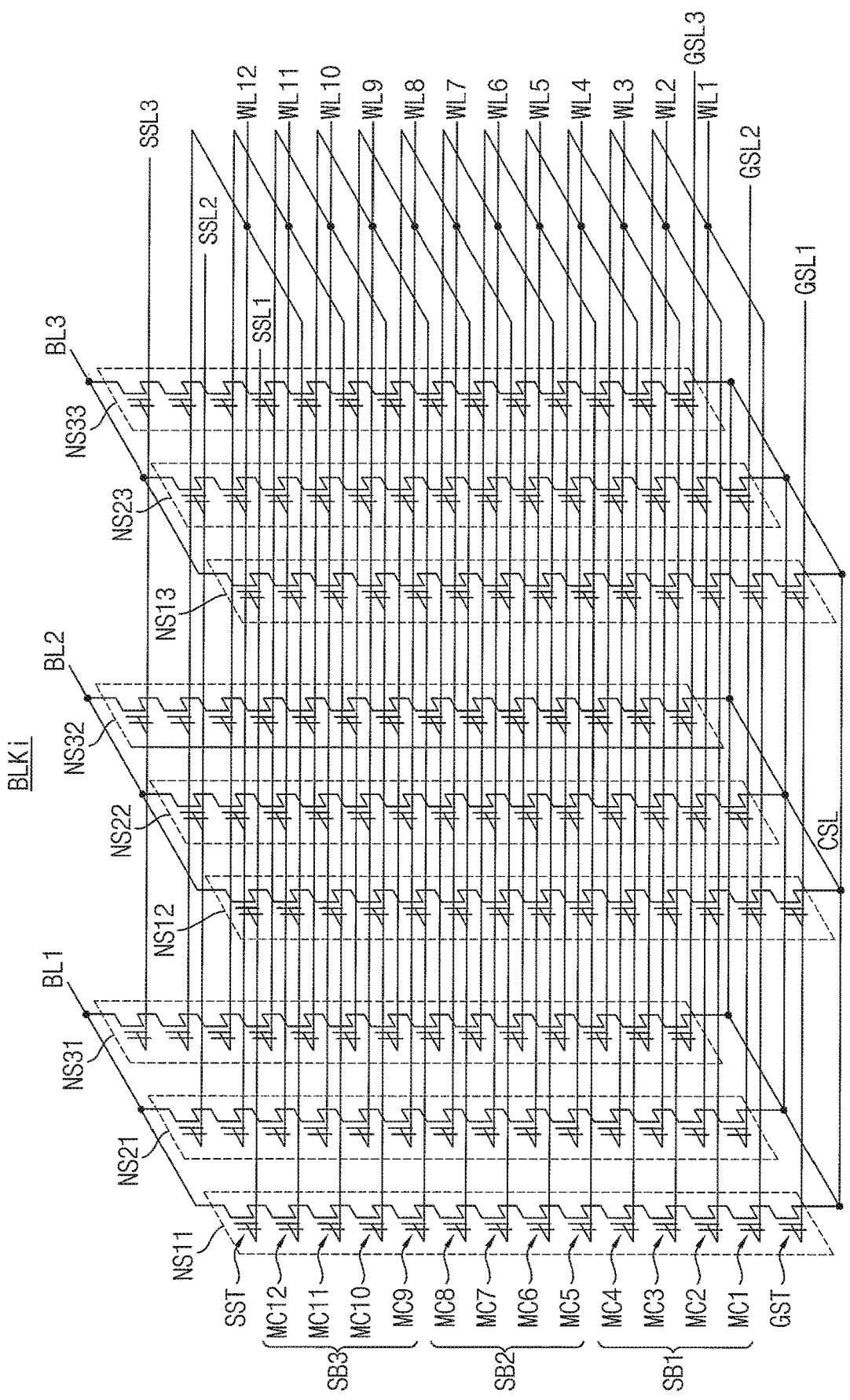
FIG. 7 is an equivalent circuit diagram illustrating the memory block of FIG. 6 according to example embodiments of the present inventive concept.

FIG. 7 is an equivalent circuit diagram illustrating the memory block of FIG. 6 according to some embodiments.

The memory block BLKi of FIG. 7 may be formed on a substrate in a three-dimensional structure (or a vertical structure). For example, a plurality of memory cell strings included in the memory block BLKi may be formed in a direction perpendicular to the substrate.

Referring to FIG. 7, the memory block BLKi may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC12, and a ground selection transistor GST. In FIG. 7, each of the memory cell strings NS11 to NS33 is illustrated to include twelve memory cells MC1 to MC12. However, some embodiments are not limited thereto. In some embodiments, each of the memory cell strings NS11 to NS33 may include any number of memory cells.

The string selection transistor SST may be connected to corresponding string selection lines SSL1 to SSL3. The plurality of memory cells MC1 to MC12 may be connected to corresponding word-lines WL1 to WL12, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

In example embodiments, dummy memory cells connected to a dummy word-line (not shown) may be coupled between the string selection transistor SST and the memory cell MC12 and/or coupled between the ground selection transistor GST and the memory cell MC1. For example, dummy memory cells may be simultaneously formed with normal memory cells with the same processes. A dummy memory cell may be activated by a dummy word-line, but may not have any "data" stored to read from a device external. For instance, data stored in a dummy memory cell electrically connected to a dummy word-line may not be transmitted outside of the memory cell array through selection signals provided by the column decoder, as is sometimes the case for normal memory cells. For instance, a dummy memory cell electrically connected to a dummy word-line may not have a connection to a bit line to transmit data therebetween as with normal memory cells.

Word-lines (e.g., WL1) having the same height may be commonly connected, and the ground selection lines GSL1 to GSL3 and the string selection lines SSL1 to SSL3 may be separated. In FIG. 7, the memory block BLKa is illustrated to be coupled to twelve word-lines WL1 to WL12 and three bit-lines BL1 to BL3. However, some embodiments are not limited thereto. In some embodiments, the memory cell array 100 may be coupled to any number of word-lines and bit-lines.

According to some embodiments, the memory block BLKi is divided into a plurality of sub-blocks, indicated by representative sub-blocks SB1, SB2, and SB3, each sub-block being smaller in size than the memory block BLKi. The sub-blocks SB1, SB2 and SB3 may be divided in a word-line direction, as shown in FIG. 7. In some embodiments, the sub-blocks SB1, SB2 and SB3 may be divided on the basis of bit-lines or string selection lines. The sub-blocks SB1, SB2 and SB3 in the memory block BLKa may be erased independently of the reference used to divide the memory block BLKa into sub-blocks.

For example, the sub-block SB1 includes memory cells coupled to the word-lines WL1, WL2, WL3 and WL4, the sub-block SB2 includes memory cells coupled to the word-lines WL5, WL6, WL7 and WL8, and the sub-block SB3 includes memory cells coupled to the word-lines WL9, WL10, WL11 and WL12, from among the memory cells included in the memory block BLKa. The memory cells included in the sub-block SB1 may be selected and erased independently of the remaining sub-blocks SB2 and SB3, and vice versa. One or more of the sub-blocks SB1, SB2, and SB3 may be selected and erased at the same time or at different times. The address decoder 600 of the nonvolatile memory device 50 (refer to FIG. 4) may provide a bias for erasing memory cells by sub-block unit.

Referring back to FIG. 4, the control circuit 500 may receive the command (signal) CMD and the address (signal) ADDR from the memory controller 40 and control an erase operation, a program operation and a read operation of the nonvolatile memory device 50 based on the command signal CMD and the address signal ADDR.

In example embodiments, the control circuit 500 of FIG. 4 may generate the control signals CTLs, which are used for controlling the voltage generator 700, and may generate the page buffer control signal PBC for controlling the page buffer circuit 410, based on the command signal CMD, and generate a row address R_ADDR and a column address C_ADDR based on the address signal ADDR. The control circuit 500 of FIG. 4 may provide the row address R_ADDR to the address decoder 600 and provide the column address C_ADDR to the data input/output circuit 420. In addition, the control circuit 500 may provide the address decoder 600 with a first mode signal MS1 in response to a detection signal DS provided from the substrate monitor circuit 430. The first mode signal MS1 indicates that a voltage level of the substrate 111 reaches a reference level or indicates that the voltage level of the substrate 111 is maintained at a constant level during a reference time interval. In addition, the control circuit 500 may provide the address decoder 600 with a second mode signal MS2 indicating operation designated by the command SMD.

The address decoder 600 of FIG. 4 may be coupled to the memory cell array 100 through the string selection line SSL, the plurality of word-lines WLs, and the ground selection line GSL. The voltage generator 700 may generate the word-line voltages VWLs, which are required for the operation of the nonvolatile memory device 50, based on the control signals CTLs. The voltage generator 700 may receive the power PWR from the memory controller 40. The word-line voltages VWLs may be applied to the plurality of word-lines WLs through the address decoder 600.

For example, during the sub-block erase operation, the voltage generator 700 may apply the erase voltage VERS to a well of the memory block or the substrate 111 and may apply a word-line erase voltage (e.g., a ground voltage) to word-lines of a selected sub-block. During the erase verification operation, the voltage generator 700 may apply an erase verification voltage to the entire word-lines of the selected sub-block or sequentially apply the erase verification voltage to word-lines of the selected sub-block on a word-line basis.

For example, during the program operation, the voltage generator 700 may apply a program voltage to the selected word-line and may apply a program pass voltage to the unselected word-lines. In addition, during the program verification operation, the voltage generator 700 may apply a program verification voltage to the selected word-line and may apply a verification pass voltage to the unselected word-lines. In addition, during the read operation, the voltage generator 700 may apply a read voltage to the selected word-line and may apply a read pass voltage to the unselected word-lines.

The page buffer circuit 410 may be coupled to the memory cell array 100 through the plurality of bit-lines BLs. The page buffer circuit 410 may include a plurality of page buffers. In some embodiments, one page buffer may be connected to one bit-line. In some embodiments, one page buffer may be connected to two or more bit-lines.

The page buffer circuit 410 may temporarily store data to be programmed in a selected page or data read out from the selected page of the memory cell array 100. The page buffer circuit 410 may include a plurality of page buffers. The page buffer circuit 410 may temporarily store data to be programmed in a selected page and may temporarily store data read from the selected page.

The data input/output circuit 420 may be coupled to the page buffer circuit 410 through data lines DLs. During the program operation, the data input/output circuit 420 may receive program data DATA from the memory controller 40 and provide the program data DATA to the page buffer circuit 410 based on the column address C_ADDR received from the control circuit 500. During the read operation, the data input/output circuit 420 may provide read data DATA, which are stored in the page buffer circuit 410, to the memory controller 40 based on the column address C_ADDR received from the control circuit 500.

During the erase operation, the substrate monitor circuit 430 may monitor a voltage level of a substrate voltage (or a voltage level of the substrate 111) VSUB in response to the erase voltage VERS applied to the substrate and may provide the control circuit 500 with the detection signal DS indicating that a level of the substrate voltage VSUB reaches a reference level and/or indicating that the level of the substrate voltage VSUB is maintained at a level of the erase voltage VERS during a reference time interval.

Figure 8:
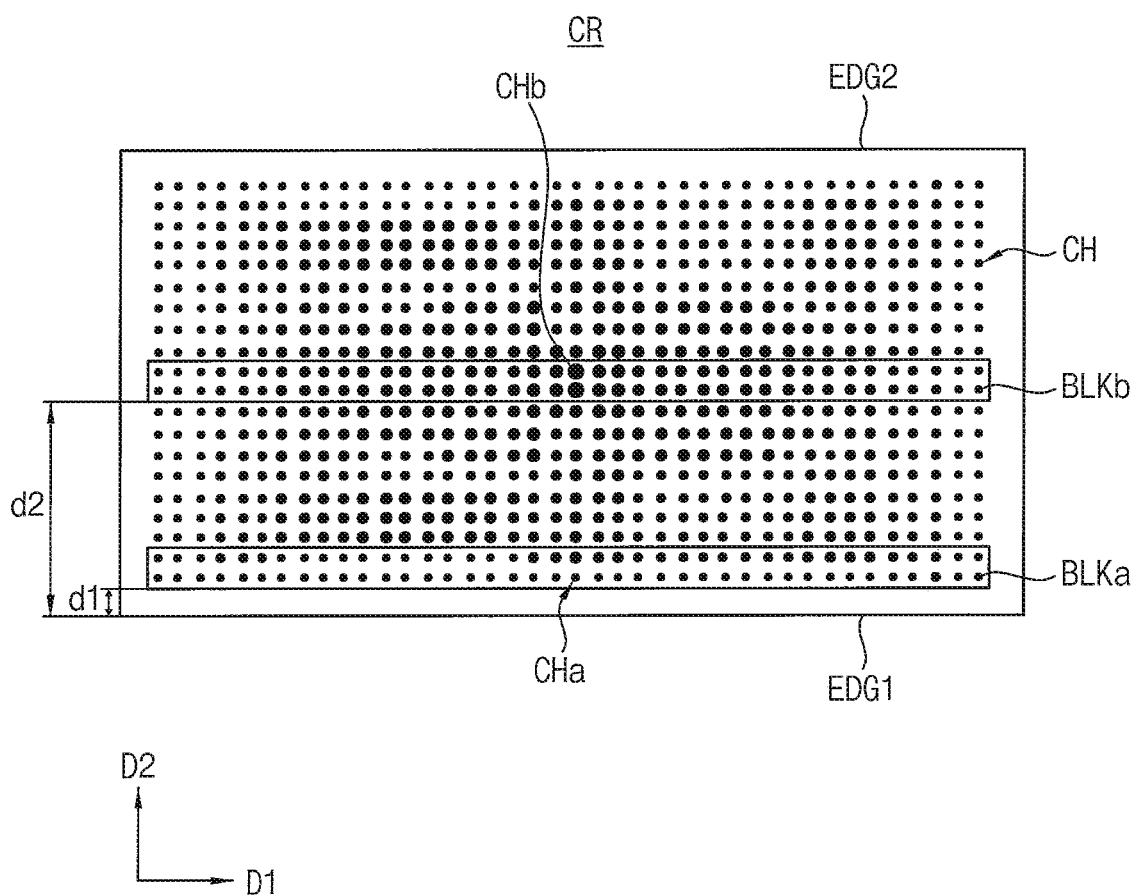
FIG. 8 illustrates a cell region in which the memory cell array of FIG. 4 is formed according to example embodiments of the present inventive concept.

FIG. 8 illustrates a cell region in which the memory cell array of FIG. 4 is formed according to some embodiments.

Referring to FIG. 8, a cell region CR includes a plurality of channel holes CH.

A channel hole size, for example, a channel hole diameter, may be varied according to positions within the cell region CR. For example, channel holes CH adjacent to the first and second edges EDG1 and EDG2 have a low peripheral density, and thus may have a different diameter from those of other channel holes CH. A memory block BLKa may be adjacent to the second edge EDG2, and may be spaced apart from the second edge EDG2 by a first distance d1. A memory block BLKb may not be adjacent to the first and second edges EDG1 and EDG2, and be in a center of the cell region CR, and may be spaced apart from the second edge EDG2 by a second distance d2. The second distance d2 may be greater than the first distance d1. A first diameter D1 of a first channel hole CHa included in the memory block BLKa may be smaller than a second diameter D2 of a second channel hole CHb included in the memory block BLKb.

Figure 9A:
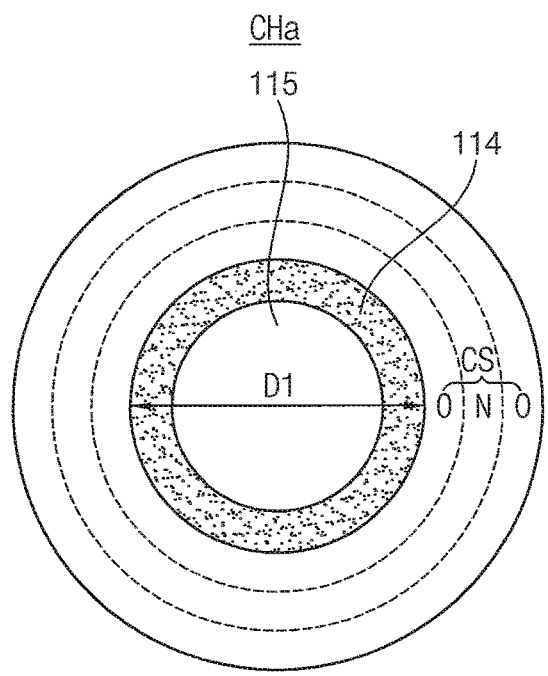
FIGS. 9A and 9B illustrate cross-sections of strings of the memory blocks of FIG. 8, respectively according to example embodiments of the present inventive concept.
Figure 9B:
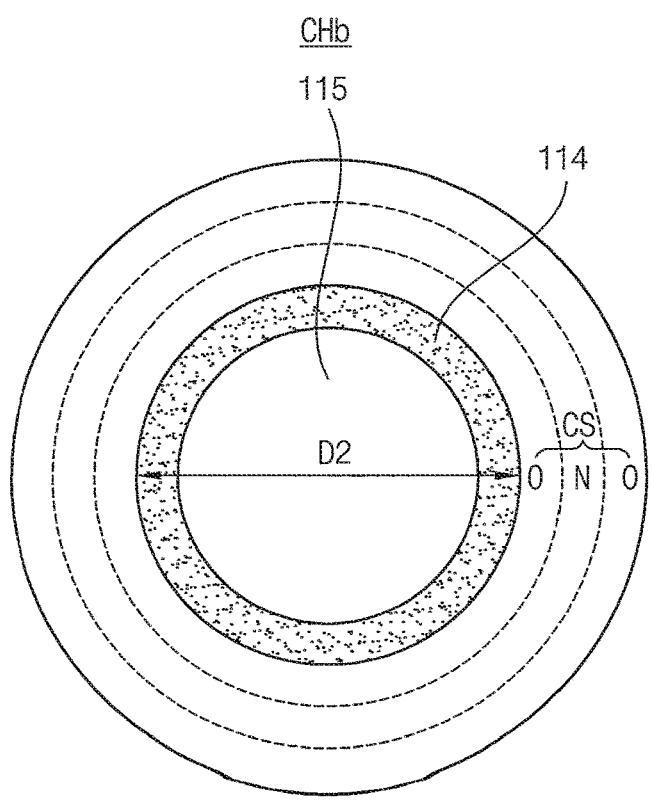

FIGS. 9A and 9B illustrate cross-sections of strings of the memory blocks BLKa and BLKb of FIG. 8, respectively.

Referring to FIG. 9A, a pillar including a channel layer 114 and an internal layer 115 may be formed in the first channel hole CHa included in the memory block BLKa, and a charge storage layer CS may be formed around the first channel hole CHa, and the charge storage layer CS may have an (oxide-nitride-oxide) ONO structure.

Referring to FIG. 9B, a pillar including a channel layer 114 and an internal layer 115 may be formed in the second channel hole CHb included in the memory block BLKb, and a charge storage layer CS may be formed around the second channel hole CHb, and the charge storage layer CS may have an ONO structure.

In an example embodiment, a thickness of the charge storage layer CS included in the memory block BLKb may be different from a thickness of the charge storage layer CS included in the memory block BLKa. Characteristics of memory cells may vary due to the difference in the channel hole diameters. For example, in a 3D memory device having a gate all around structure in which a gate electrode is disposed around a circumference of a channel hole, if a channel hole diameter is reduced, the magnitude of an electric field formed between a gate electrode (e.g., the gate electrode 211 of FIG. 6) and a channel region 114 is increased. Thus, program and erase speeds of a memory cell having a relatively small channel hole diameter like the first channel hole CHa may be higher than those of a memory cell having a relatively large channel hole diameter like the second channel hole CHb.

Referring back to FIG. 8, a memory block is formed in the cell region CR to include all memory cells corresponding to one page in the first direction D1, that is, in a word-line direction, and to include some strings in the second direction D2, that is, in a bit-line direction. Thus, each memory block extends in the first direction D1, and channel hole sizes, that is, channel hole diameters may differ in units of memory blocks. Thus, program and erase speeds of memory cells included in the memory block BLKa may be higher than program and erase speeds of memory cells included in the memory block BLKb.

Figure 10:
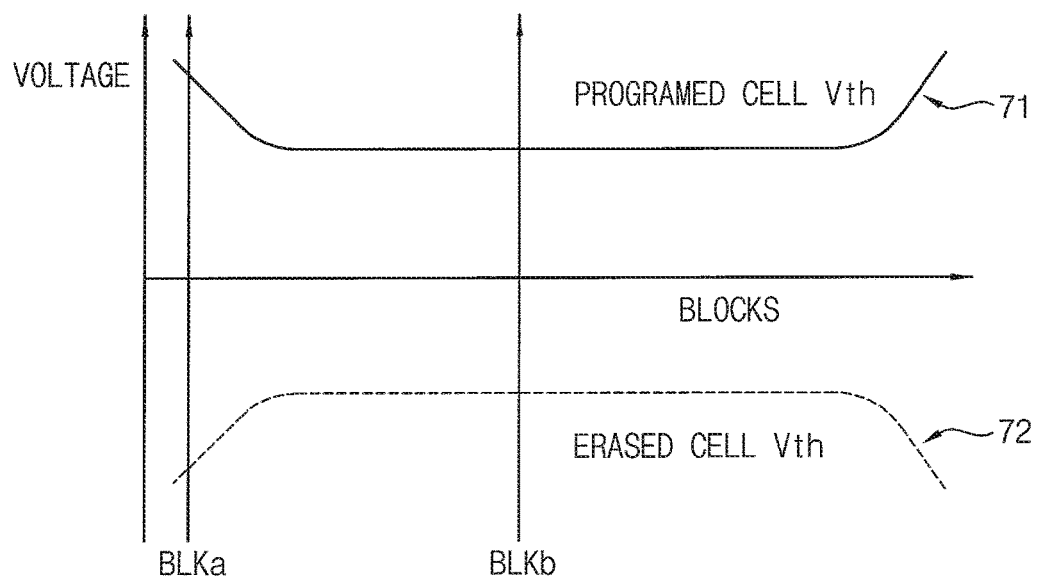
FIG. 10 is a graph showing a result of performing a program operation and an erase operation on the memory blocks in FIG. 8 according to example embodiments of the present inventive concept.

FIG. 10 is a graph showing a result of performing a program operation and an erase operation on the memory blocks in FIG. 8.

Referring to FIG. 10, a horizontal axis denotes position of memory blocks in the second direction D2, that is, a bit-line direction, and a vertical axis denotes a threshold voltage. For example, a solid line 71 denotes a central value of threshold voltages according to memory block positions of a programmed memory cell, and a dotted line 72 denotes a central value of threshold voltages according to memory block positions of an erased memory cell.

As described above, the threshold voltage distribution, as indicated by the solid line 71, of programmed memory cells may have a U shape. As indicated by the U-shaped graph, programming of memory cells at memory block positions nearer an upper and/or lower edge of the memory device may need a higher threshold voltage. In addition, the threshold voltage distribution, as indicated by the dotted line 72, of erased memory cells may have an inverted U. As indicated by the inverted U-shaped graph, erasing of memory cells at memory block positions nearer an upper and/or lower edge of the memory device may need a lower threshold voltage.

Figure 11:
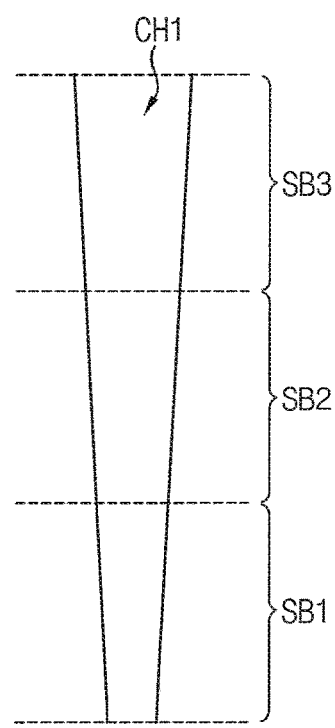
FIG. 11 illustrates an example of a vertical structure in FIG. 8 according to example embodiments of the present inventive concept.

FIG. 11 illustrates an example of a vertical structure in FIG. 8.

Referring to FIG. 11, a channel hole CH1 corresponding to a string included in a 3D memory device is illustrated. As described above, the channel hole CH1 is formed by etching portions of gate electrodes and insulation layers stacked on a substrate, and thus, the channel hole CH1 may be a tapered etching profile where a diameter of the channel hole CH1 is becoming downwardly smaller. Thus, a diameter of the channel hole CH1 may be smaller towards the substrate.

In some embodiments, the channel hole CH1 may be divided into three zones according to channel hole diameters. For example, a zone in which a channel hole diameter is smaller than a first value may be referred to as a first zone, and a zone in which a channel hole diameter is equal to or greater than the first value and smaller than a second value may be referred to as a second zone, and a zone in which a channel hole diameter is equal to or greater than the second value and smaller than a third value may be referred to as a third zone. The first zone corresponds to the sub-block SB1, the second zone corresponds to the sub-block SB2 and the third zone corresponds to the sub-block SB3. Therefore, memory cells in one channel hole may have different characteristics due to difference of diameters of the channel hole according to positions of sub-blocks. Therefore, program and erase speeds of memory cells included in one channel hole may be different according to positions of sub-blocks, as indicated in the graph of FIG. 10.

Figure 12:
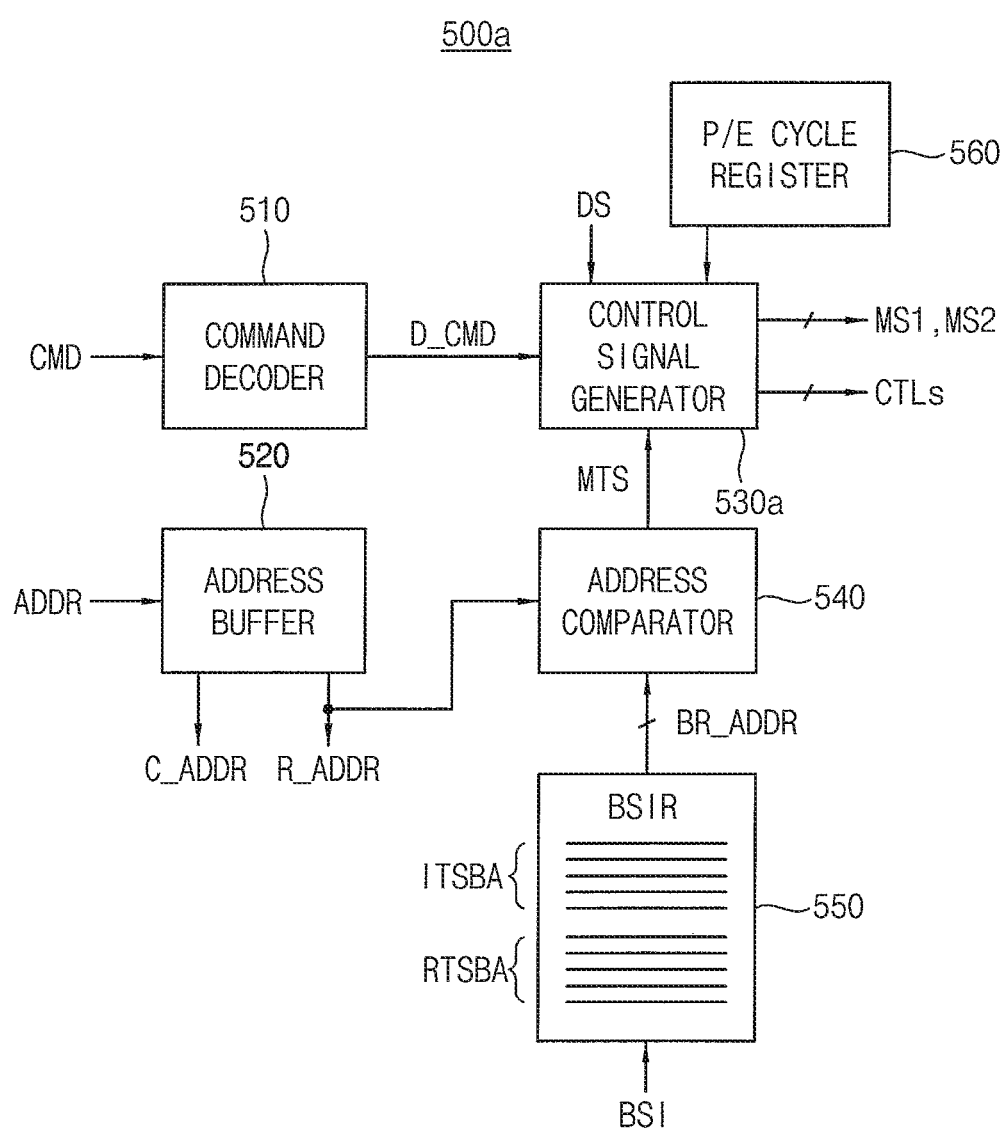
FIG. 12 is a block diagram illustrating an example of the control circuit in the nonvolatile memory device of FIG. 4 according to example embodiments of the present inventive concept.

FIG. 12 is a block diagram illustrating an example of the control circuit in the nonvolatile memory device of FIG. 4 according to example embodiments.

Referring to FIG. 12, a control circuit 500a may include a command decoder 510, an address buffer 520, a control signal generator 530a, an address comparator 540, a bad sub-block information register (BSIR) 550 and a program/erase (P/E) cycle information register 560.

The command decoder 510 decodes the command CMD and provides a decoded command D_CMD to the control signal generator 530a. The address buffer 520 receives the address signal ADDR, provides the row address R_ADDR to the address decoder 600 and the address comparator 540 and provides the column address C_ADDR to the data input/output circuit 420.

The bad sub-block information register 550 may store the bad sub-block information BSI, and the bad sub-block information BSI may include initial bad sub-block addresses ITSBA and run-time bad sub-block addresses RTSBA. The initial bad sub-block addresses ITSBA are addresses of bad sub blocks designated when the nonvolatile memory device 50 is shipped. The run-time bad sub-block addresses RTSBA are addresses of bad sub blocks designated when the nonvolatile memory device 50 is operating.

The address comparator 540 compares the row address R_ADDR with at least one bad sub-block row address BR_ADDR stored in the bad sub-block information register 550 and provides the control signal generator 530a with a match signal MTS indicating a result of the comparison of the row address R_ADDR with the at least one bad sub-block row address BR_ADDR.

The control signal generator 530a receives the decoded command D_CMD and the match signal MTS, generates the control signals CTLs based on whether an operation directed by the decoded command D_CMD is associated with the bad sub-block and provides the control signals CTLs to the voltage generator 700. In addition, the control signal generator 530a receives the detection signal DS and provides the address decoder 600 with the first mode signal MS1 indicating that the level of the substrate voltage VSUB reaches the reference level or that the level of the substrate voltage VSUB is maintained at a certain level, based on the detection signal DS. In addition, the control signal generator 530a provides the address decoder 600 with the second mode signal MS indicating the operation designated by the decoded command D_CMD.

When the match signal MTS indicates that the row address R_ADDR accesses the normal sub-block, the control signal generator 530a generates the control signals CTLs by referring to the program/erase cycle information register 560 such that a first program/erase cycle is applied to the normal sub-block. When the match signal MTS indicates that the row address R_ADDR accesses the bad sub-block, the control signal generator 530a generates the control signals CTLs by referring to the program/erase cycle information register 560 such that a second program/erase cycle is applied to the bad sub-block. The first program/erase cycle is greater than the second program/erase cycle. Therefore, the program/erase cycle on the bad sub-block is slacked and thus endurance of the nonvolatile memory device 50 may be increased.

Figure 13:
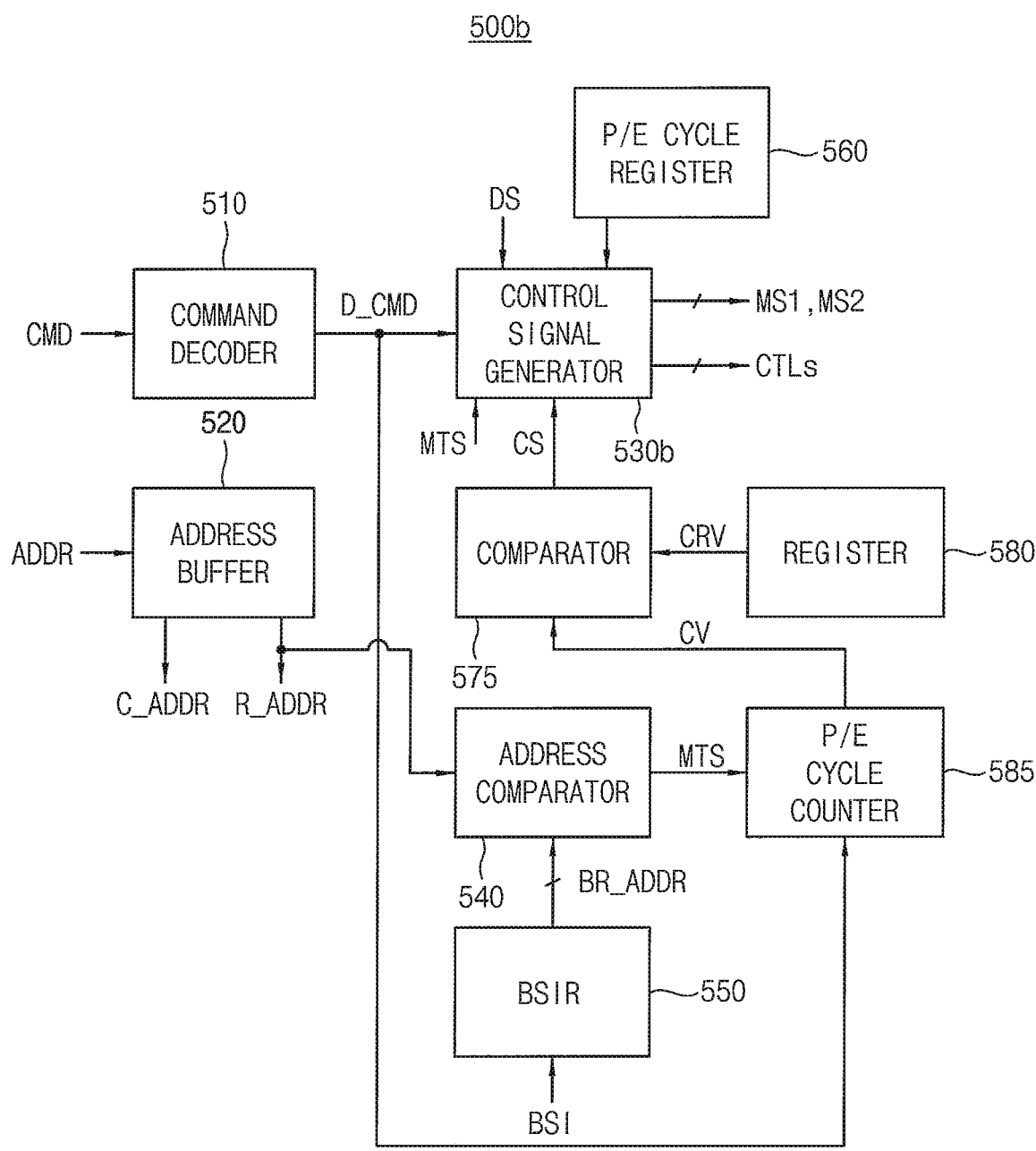
FIG. 13 is a block diagram illustrating another example of the control circuit in the nonvolatile memory device of FIG. 4 according to example embodiments of the present inventive concept.

FIG. 13 is a block diagram illustrating another example of the control circuit in the nonvolatile memory device of FIG. 4 according to example embodiments.

Referring to FIG. 13, a control circuit 500b may include a command decoder 510, an address buffer 520, a control signal generator 530b, an address comparator 540, a bad sub-block information register 550, a program/erase cycle information register 560, a comparator 575, a register 580 and a program/erase cycle register 585.

The control circuit 500b of FIG. 13 differs from the control circuit 500a of FIG. 12 in that the control circuit 500b further includes the comparator 575, the register 580 and the program/erase cycle register 585 and in that the address comparator 540 further provides the match signal MTS to the program/erase cycle register 585.

The program/erase cycle register 585 increases a counting value CV when the row address R_ADDR accesses the bad sub-block and the decoded command D_CMD corresponds to a program command or an erase command, based on the match signal MTS and the decoded command D_CMD. The comparator 575 compares the counting value CV and a reference counting value CRV stored in the register 580 and provides the control signal generator 560b with a comparison signal CV indicating a result of the comparison. The control signal generator 530b receives decoded command D_CMD, the match signal MTS, the comparison signal CS and the done signal DS and generates the control signals CTLS, the first mode signal MS1 and the second mode signal MS2 such that a second program/erase cycle is applied to the bad sub-block when the counting value CV is smaller and equal to the reference counting value and a third program/erase smaller than the reference counting value CRV and the second program/erase cycle is applied to the bad sub-block when the counting value CV exceeds the reference counting value CRV.

Figure 14:
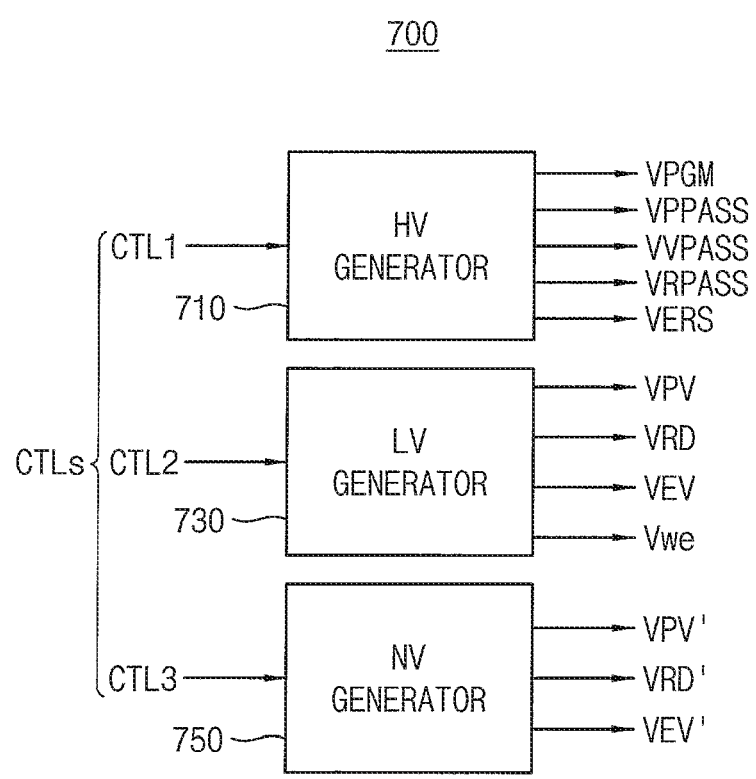
FIG. 14 is a block diagram illustrating the voltage generator in the nonvolatile memory device of FIG. 4 according to example embodiments of the present inventive concept.

FIG. 14 is a block diagram illustrating the voltage generator in the nonvolatile memory device of FIG. 4 according to some embodiments.

Referring to FIG. 14, the voltage generator 700 may include a high voltage generator 710 and a low voltage generator 730. The voltage generator 700 may further include a negative voltage generator 750.

The high voltage generator 710 may generate a program voltage VPGM, a program pass voltage VPPASS, a verification pass voltage VVPASS, a read pass voltage VRPASS and an erase voltage VERS according to operations directed by the command CMD (or, a decoded command D_CMD), in response to a first control signal CTL1 of the control signals CTLs. The program voltage VPGM is applied to the selected word-line, the program pass voltage VPPASS, the verification pass voltage VVPASS, the read pass voltage VRPASS may be applied to the unselected word-lines and the erase voltage VERS may be applied to the well or the substrate of the memory block. The first control signal CTL1 may include a plurality of bits which indicate the operations directed by the command CMD.

The low voltage generator 730 may generate a program verification voltage VPV, a read voltage VRD, an erase verification voltage VER and a word-line erase voltage Vwe according to operations directed by the command CMD, in response to a second control signal CTL2 of the control signals CTLs. The program verification voltage VEV, the read voltage VRD, and the erase verification voltage VEV may be applied to the selected word-line according to operation of the nonvolatile memory device 200. The word-line erase voltage Vwe may be applied to word-lines of the selected sub-block. The second control signal CTL2 may include a plurality of bits which indicate the operations directed by the command CMD.

The negative voltage generator 750 may generate a program verification voltage VPV', a read voltage VRD' and an erase verification voltage VEV' which have negative levels according to operations directed by the command CMD, in response to a third control signal CTL3 of the control signals CTLs. The third control signal CTL3 may include a plurality of bits which indicate the operations directed by the command CMD.

Figure 15:
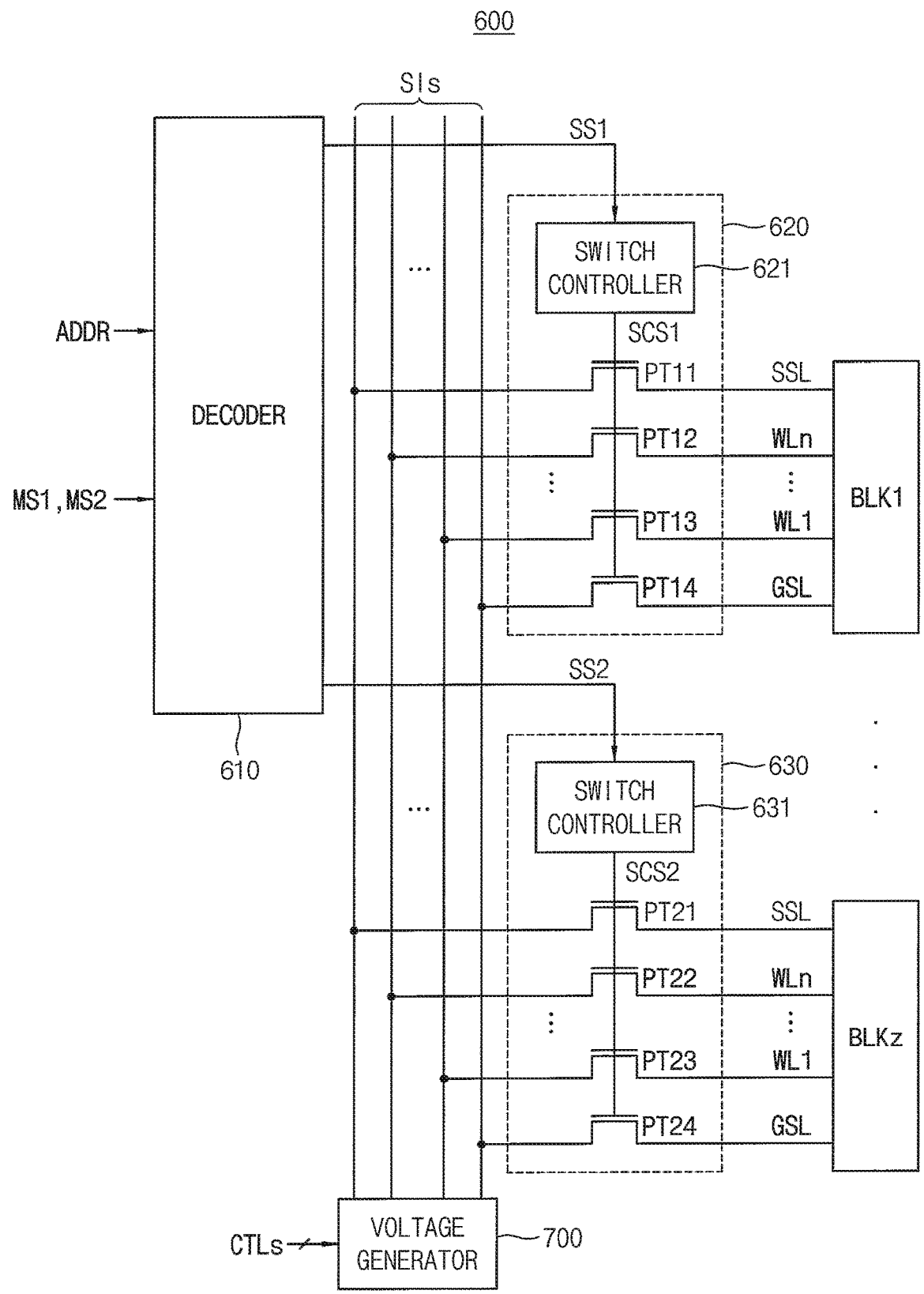
FIG. 15 is a block diagram illustrating the address decoder in the nonvolatile memory device of FIG. 4 according to example embodiments of the present inventive concept.

FIG. 15 is a block diagram illustrating the address decoder in the nonvolatile memory device of FIG. 4 according to some embodiments.

Referring to FIG. 15, the address decoder 600 includes a decoder 610, a first switch circuit 620 and a second switch circuit 630.

The decoder 610 receives the address ADDR (e.g., the row address R_ADDR) and the mode signal MS, generates a first selection signal SS1 and a second selection signal SS2 according to a sub-block directed by the address ADDR and the level of the substrate voltage VSUB or maintaining time interval of the substrate voltage VSUB indicated by the mode signal and provides the first selection signal SS1 and the second selection signal SS2 to the first switch circuit 620 and the second switch circuit 630, respectively. As an example, each of the first selection signal SS1 and the second selection signal SS2 may have a plurality of selection signals for selecting a block among the plurality of blocks in the memory cell array 100.

The first switch circuit 620 and the second switch circuit 630 may be coupled to a plurality of selection lines S1s coupled to the voltage generator 700. The voltage generator 700 may provide the various word-line voltages VWLs to the plurality of selection lines S1s. The first switch circuit 620 is coupled to the memory block BLK1 through at least one string selection line SSL, a plurality of word-lines WL1~WLn and at least one ground selection line GSL. The second switch circuit 630 is coupled to the memory block BLKz through at least one string selection line SSL, a plurality of word-lines WL1~WLn and at least one ground selection line GSL. The ground selection line GSL for BLK1 . . . BLKz may be different (i.e. independent) for each of the first switch circuit 620 and the second switch circuit 630.

The first switch circuit 620 includes a switch controller 621 and a plurality of pass transistors PT11~PT14 coupled to the string selection line SSL, the word-lines WL1~WLn and the ground selection line GSL of the memory block BLK1. The switch controller 621 may control turn-on and turn-off of the pass transistors PT11~PT14 by providing a first switching control signal SCS1 to the pass transistors PT11~PT14 in response to the first selection signal SS1. As an example, the first switching control signal SCS1 may have a plurality of first switching control signals for selecting a sub-block among the plurality of sub-blocks in the memory block BLK1 in response to the first selection signal SS1. As an example, the switch controller 621 may control turn-on timing (e.g., a time interval) of the pass transistors PT11~PT14 by selecting a particular time interval from among a plurality of different time intervals in response to the first switching control signals of the first switching control signal SCS1.

The second switch circuit 630 includes a switch controller 631 and a plurality of pass transistors PT21~PT24 coupled to the string selection line SSL, the word-lines L1~WLn and the ground selection line GSL of the memory block BLKz. The switch controller 631 may control turn-on and turn-off of the pass transistors PT21~PT24 by providing a second switching control signal SCS2 to the pass transistors PT21~PT24 in response to the second selection signal SS2. As an example, the second switching control signal SCS2 may have a plurality of second switching control signals for selecting a sub-block among the plurality of sub-blocks in the memory block BLKz in response to the second selection signal SS2. The switch controller 631 may control turn-on timing (e.g., a time interval) of the pass transistors PT21~PT24 by selecting a particular time interval from among a plurality of different time intervals in response to the second switching control signals of the second switching control signal SCS2.

Figure 16:
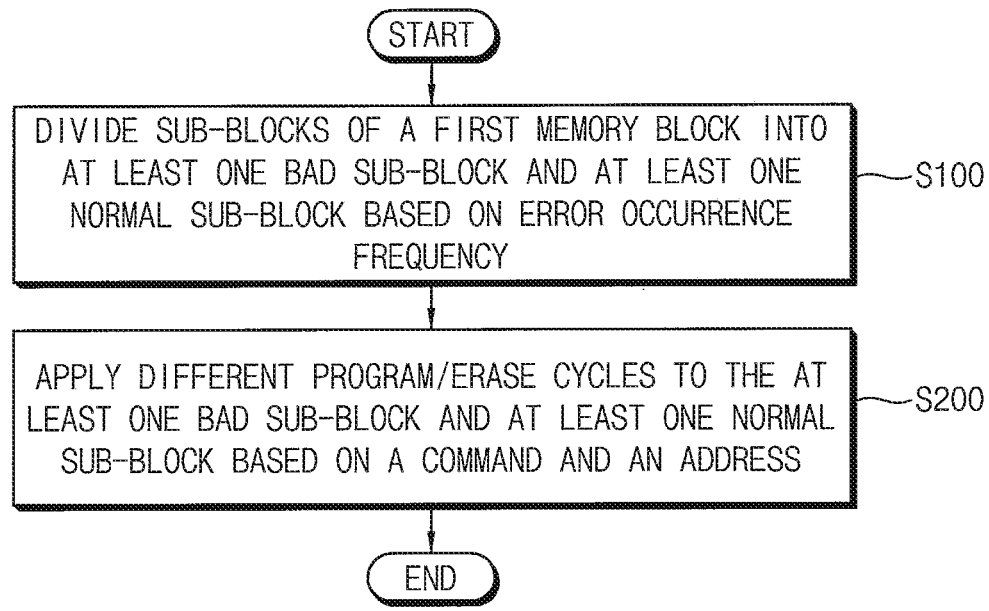
FIG. 16 is a flow chart illustrating a method of operating a nonvolatile memory device according to example embodiments of the present inventive concept.

FIG. 16 is a flow chart illustrating a method of operating a nonvolatile memory device according to some embodiments.

Hereinafter, it is assumed that the first sub-block SB1 of the sub-blocks SB1, SB2 and SB3 in the memory block BLKi of FIG. 7, which is adjacent to the substrate, corresponds to at least one bad sub-block and the second and third sub-blocks SB2 and SB3 correspond to at least one normal sub-block.

A block in a NAND flash memory may suffer from a malfunction caused by program failure or erase failure. In this case, the block is regarded as a run-time bad block and replaced with another block previously reserved. Besides a run-time bad block, there may be an initial bad block that is already known as a bad block when a NAND flash memory is shipped from a factory. Generally, a small number of run-time bad blocks are generated over a long period of time when a NAND flash memory is used. In addition, a small number of initial bad blocks normally exist when the NAND flash memory is shipped from a factory. However, if a large number of run-time bad blocks are generated in a short period of time or a large number of initial bad blocks exist in the early stage, all reserved blocks may be exhausted. Therefore, a nonvolatile memory device cannot be used any longer. For this reason as well, the lifetime of the semiconductor storage device is limited.

Since the first sub-block SB1 is formed adjacent to the substrate and have a narrow channel width, memory cells in the first sub block SB1 are greatly influenced by stress due to the program voltage or the erase voltage. Therefore, a probability of error occurrence is higher in the first sub-block SB1, the first sub-block SB1 may be assigned as a bad sub-block.

Referring to FIGS. 2 through 16, for overcoming the limit of the lifetime, according to some embodiments, the control circuit 500 divides sub-blocks of a first memory block of the plurality of memory blocks into at least one bad sub-block (bad sub-block) and at least one normal sub-block (normal sub-block) based on error occurrence frequency of each of the sub-blocks in the first memory block (S100). Information on the bad sub-block may be stored in the bad sub-block information registers 49 of FIG. 2 and/or 550 of FIG. 12. The control circuit 500 may apply different program/erase cycles to the bad sub-block and the normal sub-block based on the command CMD and the address ADDR (S200). The control circuit 500 may apply slacked program/erase cycle to the bad sub-block to increase the lifetime of the nonvolatile memory device 50.

Figure 17:
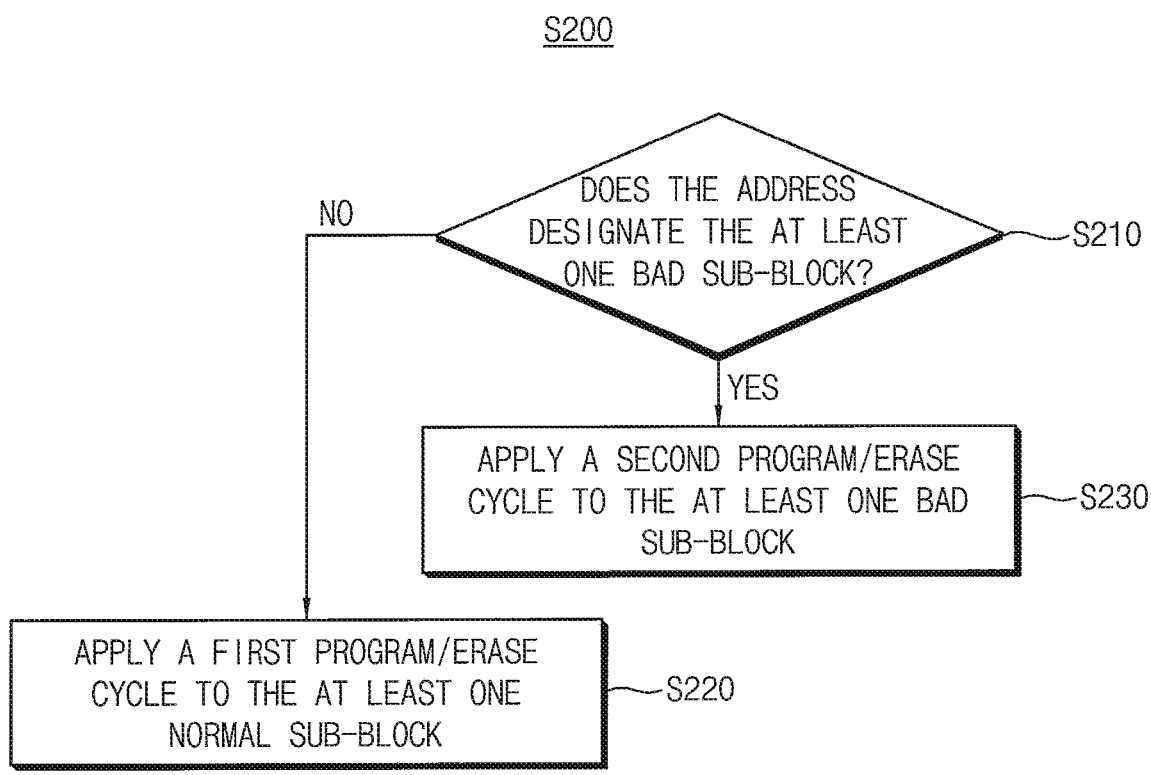
FIG. 17 is a flow chart illustrating operation of applying the different program/erase cycles in FIG. 16 in detail according to example embodiments of the present inventive concept.

FIG. 17 is a flow chart illustrating operation of applying the different program/erase cycles in FIG. 16 in detail.

Figure 18:
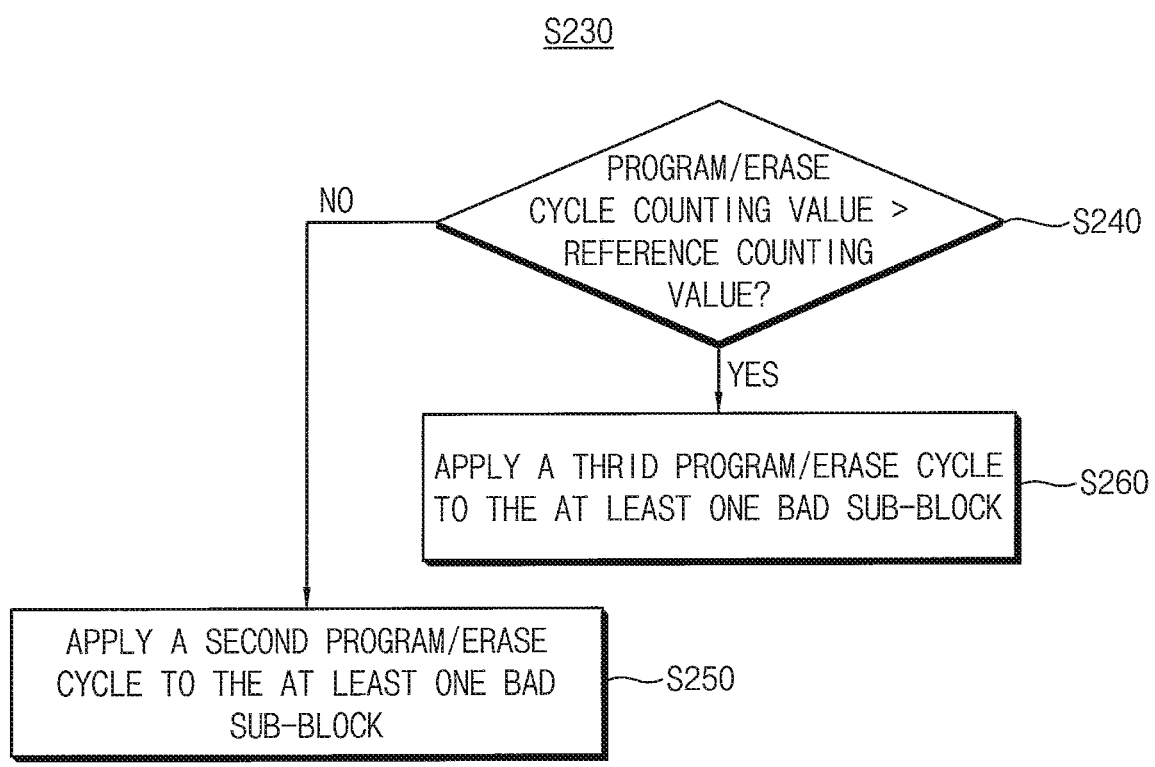
FIG. 18 is a flow chart illustrating operation of at least a second program/erase cycle is applied in detail in FIG. 17 according to example embodiments of the present inventive concept.

FIG. 18 is a flow chart illustrating operation of at least a second program/erase cycle is applied in detail in FIG. 17.

Figure 19A:
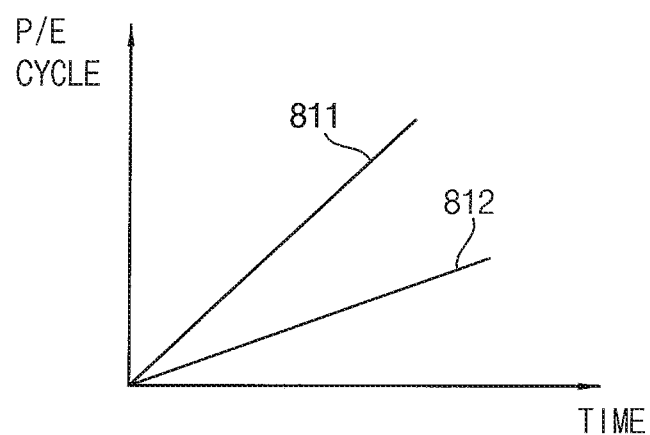
FIGS. 19A and 19B illustrate program/erase cycles applied to the normal sub-block and the bad sub-block, respectively according to example embodiments of the present inventive concept.
Figure 19B:
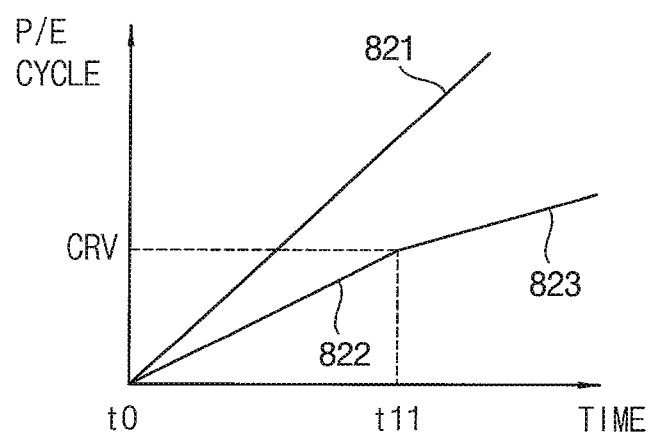

FIGS. 19A and 19B illustrate program/erase cycles applied to the normal sub-block and the bad sub-block, respectively.

Referring to FIGS. 17 through 19B, for applying different program/erase cycles to the normal sub-block and the bad sub-block (S200), the control circuit 500 of FIG. 4 determines whether the row address R_ADDR designates the bad sub-block (S210). When the row address R_ADDR designates the normal sub-block (NO in S210), the control circuit 500 controls the voltage generator 700 of FIG. 14 and the address decoder 600 of FIG. 15 by referring to the program/erase cycle information register 560 such that a first program/erase cycle 811 or 812 is applied to the normal sub-block (S220). When the row address R_ADDR designates the bad sub-block (YES in S210), the control circuit 500 controls the voltage generator 700 and the address decoder 600 by referring to the program/erase cycle information register 560 such that at least a second program/erase cycle 812 or 822 is applied to the bad sub-block (S230).

Referring to FIG. 18 for applying the at least second program/erase cycle to the bad sub-block (S230), the control circuit 500 determines whether a counting value CV of the program/erase cycle on the bad sub-block exceeds a reference counting value CRV (S240). When the counting value CV of the program/erase cycle on the bad sub-block does not exceed the reference counting value CRV (NO in S240), the control circuit 500 controls the voltage generator 700 and the address decoder 600 such that at the second program/erase cycle 822 is applied to the bad sub-block (S250) during an interval between timing points t0 and t11. When the counting value CV of the program/erase cycle on the bad sub-block exceeds the reference counting value CRV (YES in S240), the control circuit 500 controls the voltage generator 700 and the address decoder 600 such that at a third program/erase cycle 82 is applied to the bad sub-block (S260) from the timing point t11 at which the program/erase cycle on the bad sub-block exceeds the reference counting value CRV.

In FIG. 19A, the second program/erase cycle 812 is runs in less time than the first program/erase cycle 811 and in FIG. 19B, the second program/erase cycle 822 is runs in less time (i.e. a smaller time interval) than the first program/erase cycle 821 and the third program/erase cycle 823 runs in less time (i.e. a smaller time interval) than the second program/erase cycle 822.

Figure 20:
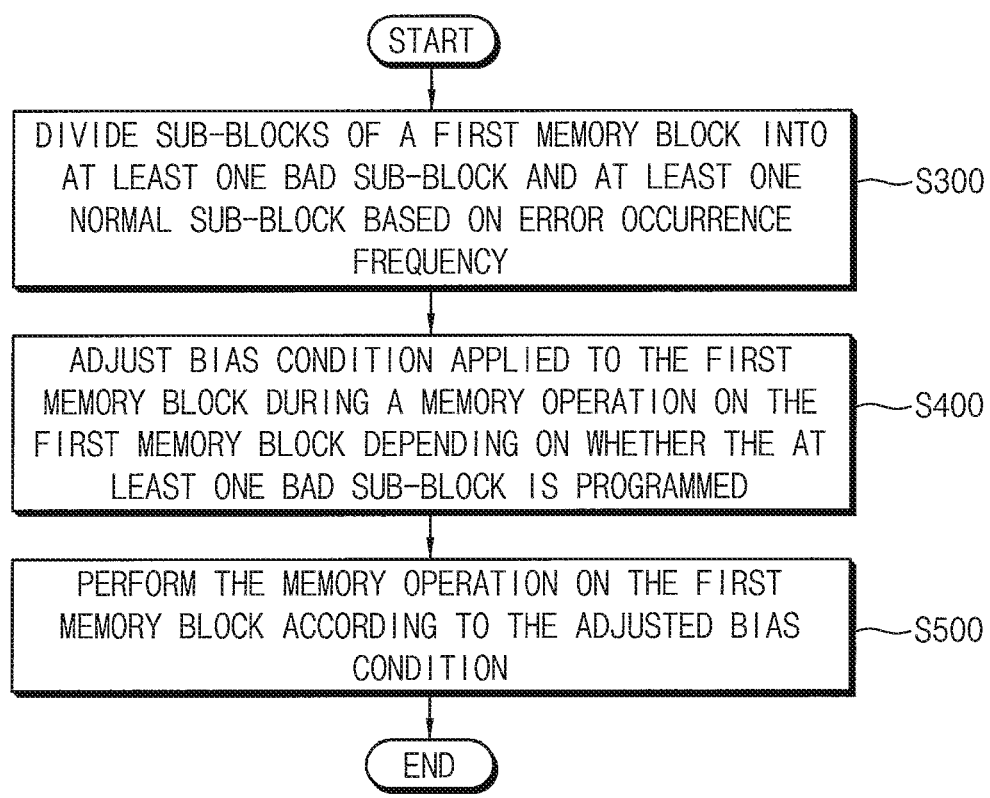
FIG. 20 is a flow chart illustrating a method of operating a nonvolatile memory device according to example embodiments of the present inventive concept.

FIG. 20 is a flow chart illustrating a method of operating a nonvolatile memory device according to some embodiments.

Hereinafter, it is assumed that the first sub-block SB1 of the sub-blocks SB1, SB2 and SB3 in the memory block BLKi of FIG. 7, which is adjacent to the substrate, corresponds to at least one bad sub-block and the second and third sub-blocks SB2 and SB3 correspond to at least one normal sub-block.

Referring to FIGS. 2 through 15 and 20, the control circuit 500 divides sub-blocks of a first memory block of the plurality of memory blocks into at least one bad sub-block (bad sub-block) and at least one normal sub-block (normal sub-block) based on error occurrence frequency of each of the sub-blocks in the first memory block (S400). The control circuit 500 adjusts a bias condition applied to the first memory block during a memory operation on the first memory block depending on whether the bad sub-block is programmed (S400). The control circuit 500 controls the voltage generator 700 and the address decoder 600 such that the memory operation is performed on the first memory block according to the adjusted bias condition (S500). The memory operation may be an erase operation or a program operation on the first memory block.

FIGS. 21A through 26B illustrate bias conditions applied to sub-blocks in the first memory block, respectively.

In FIGS. 21A through 26B, there will be descriptions on the sub-blocks SB1, SB2 and SB2 coupled to the bit-line BL1 in the memory block BLKi of FIG. 7.

Figure 21A:
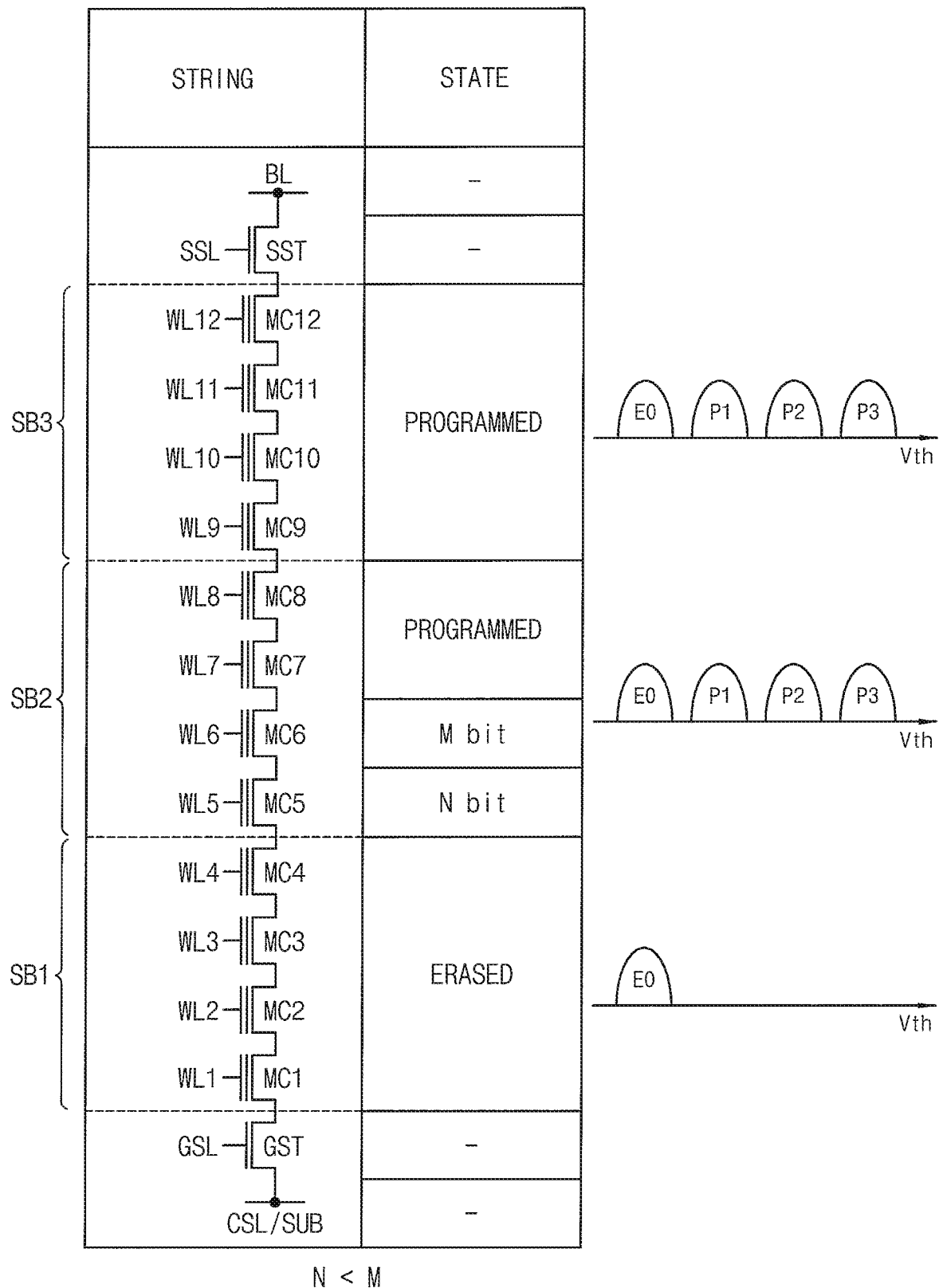
FIGS. 21A through 26B illustrate bias conditions applied to sub-blocks in the first memory block, respectively according to example embodiments of the present inventive concept.
Figure 21B:
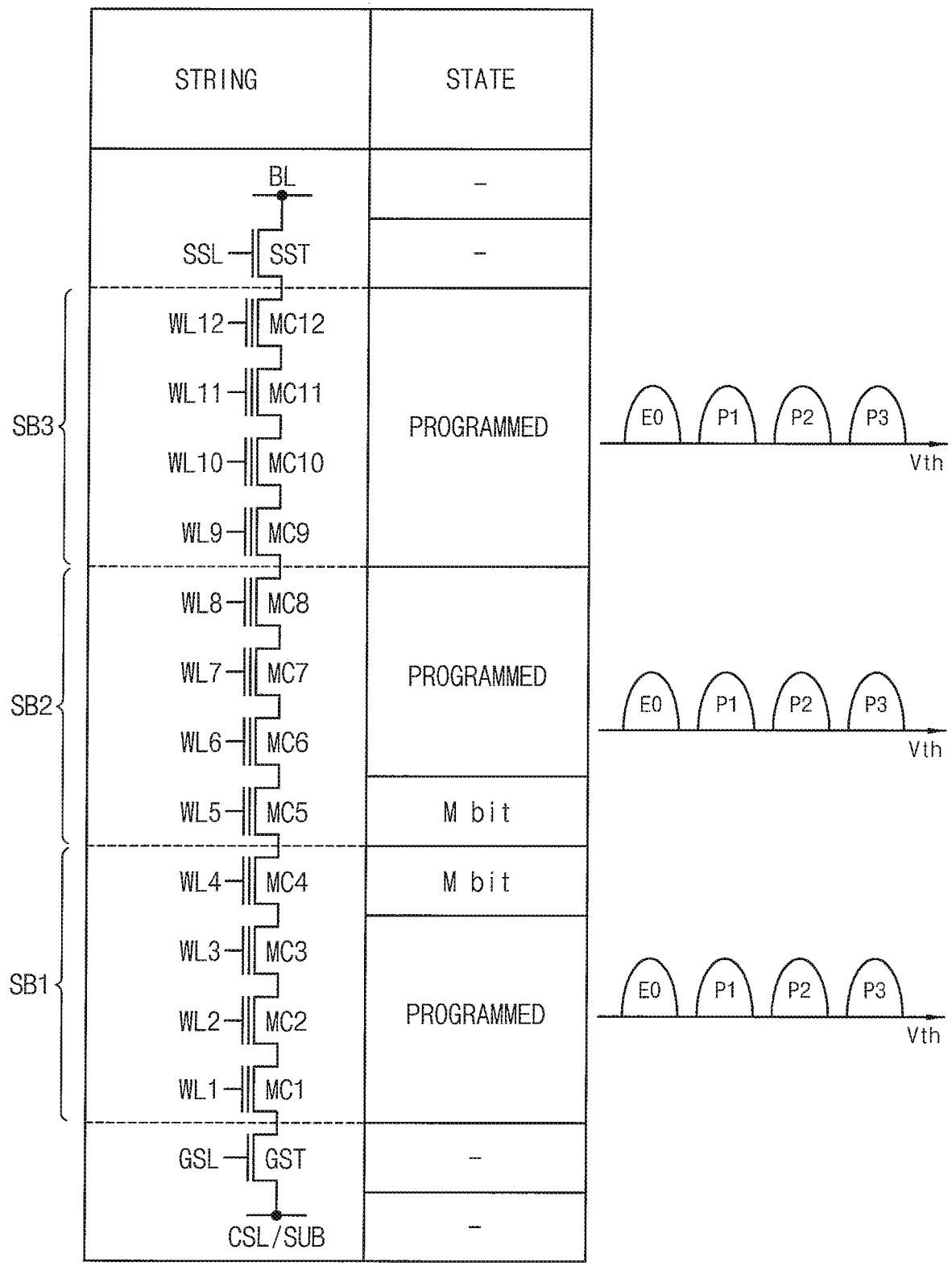

FIGS. 21A and 21B illustrate program states of the sub-block in the memory block of FIG. 7.

FIG. 21A illustrates that the second sub-block SB2 and the third sub-block SB3 are programmed to an erase state E and program states P1, P2 and P3 and FIG. 21B illustrates that the first through third sub-blocks SB1, SB2 and SB3 are programmed to the erase state E and the program states P1, P2 and P3. When the memory operation is performed on the memory block BLKi, whether the first sub-block SB1 (bad sub-block) is programmed or not influences threshold voltages of the second sub-block SB2 and the third sub-block SB3. Therefore, the control circuit 500 may adjust the bias condition applied to the first memory block based on whether the bad sub-block is programmed by considering the influence. The sub-block SB is more influenced by the bad sub-block when the bad sub-block is programmed than when the bad sub-block is not programmed.

When memory cells in each of the sub-blocks SB1, SB2, SB3 can store M-bits and when the memory operation on the first memory block is completed with the bad sub-block SB1 being not programmed, N-bits may be programmed in memory cells coupled to a boundary word-line WL5 adjacent to the bad sub-block SB1 as illustrated in FIG. 21A. Here, M is an integer greater than one and N is a natural number smaller than M. Since N-bits are programmed in the memory cells coupled to the boundary word-line WL5, margin between the program states of the memory cells coupled to the boundary word-line WL5 may be increased. In addition, when the memory operation on the first memory block is completed with the bad sub-block SB1 being programmed, M-bits may be programmed in the memory cells coupled to the boundary word-line WL5 as in FIG. 21B.

Figure 22A:
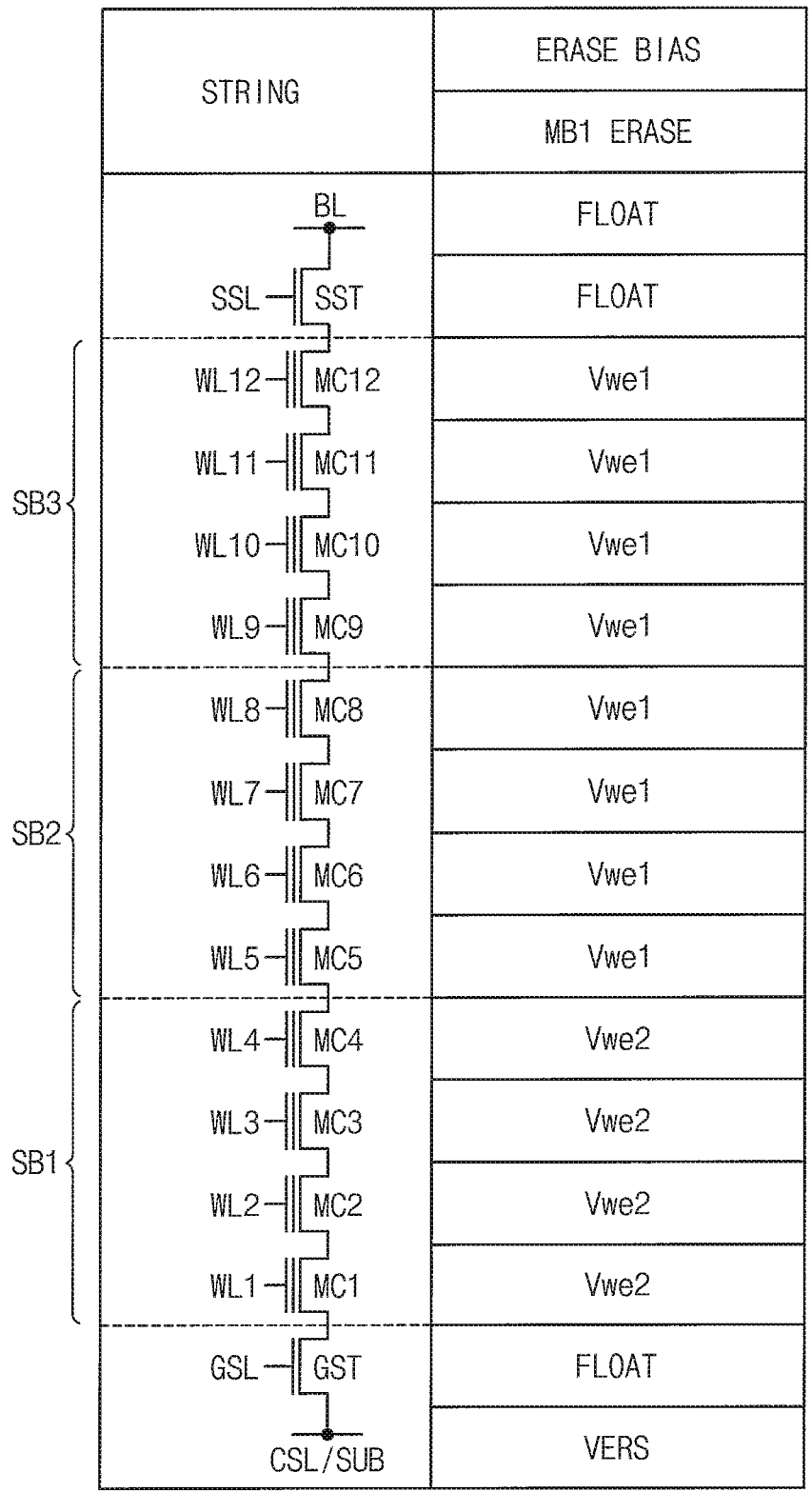

FIG. 22A illustrates an erase bias condition of the first memory block MB1 during an erase operation on the first memory block when the bad sub-block is not programmed.

Referring to FIG. 22A, the control circuit 500 controls the address decoder 600 to float the bit-line BL, the string selection line SSL and the ground selection line GSL of the cell string, controls the voltage generator 700 and the address decoder 600 to apply a first word-line erase voltage Vwe1 to the word-lines WL5~WL12 of the second and third sub-blocks SB2 and SB3, to apply a second word-line erase voltage Vwe2 to the word-lines WL1~WL4 of the bad sub-block SB1 and to apply the erase voltage VERS to the substrate. The first word-line erase voltage Vwe1 may have a ground voltage level or a positive voltage level which is substantially the same as the ground voltage level and the second word-line erase voltage Vwe2 is higher than the first word-line erase voltage Vwe1. Therefore, over-erase of the bad sub-block BS1 may be prevented.

Figure 22B:
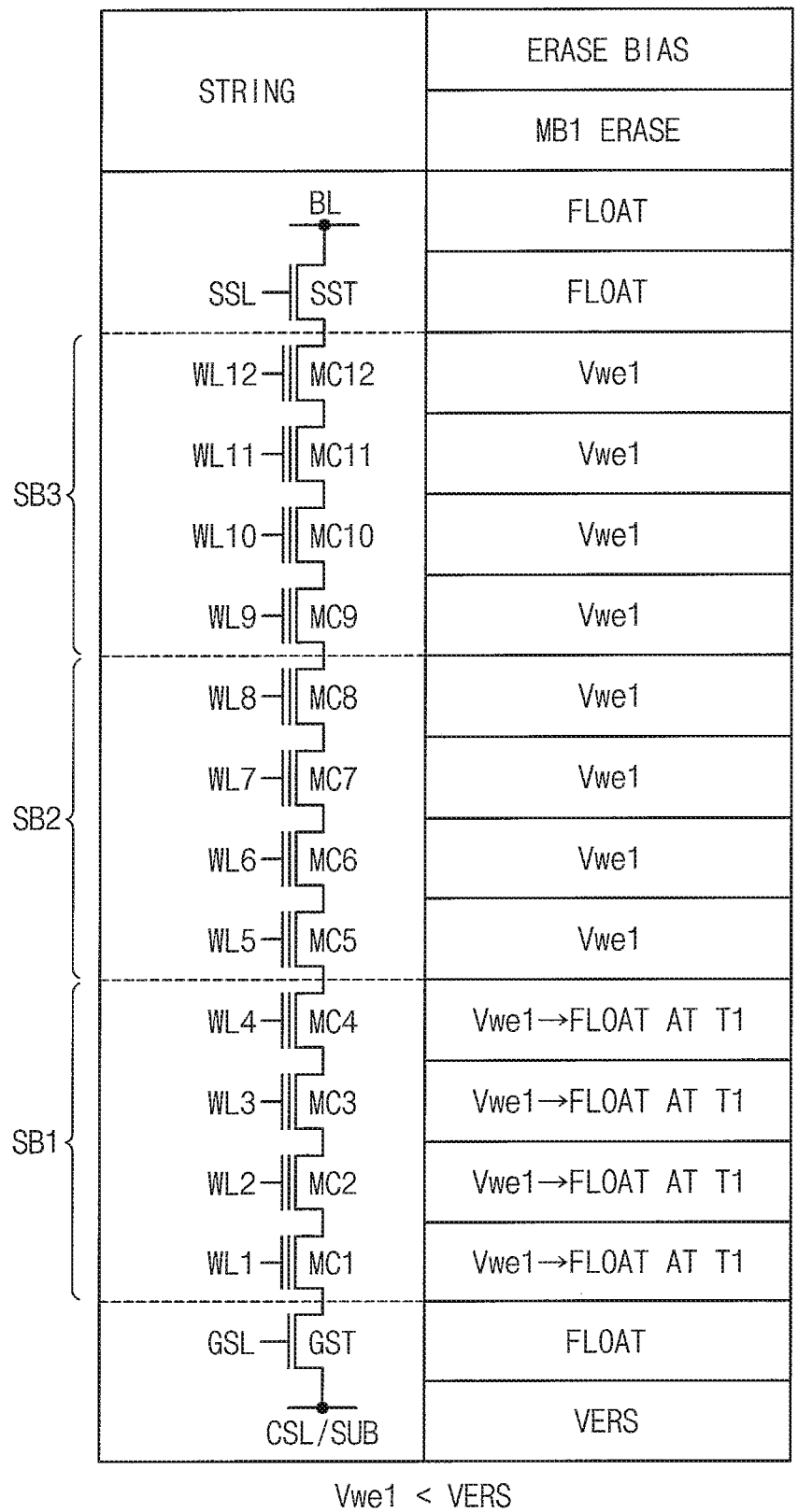
Figure 23A:
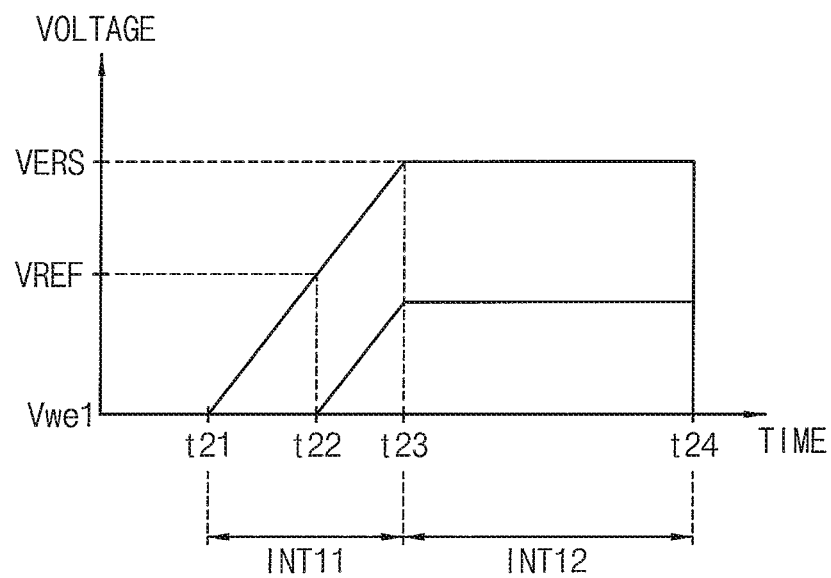
Figure 23B:
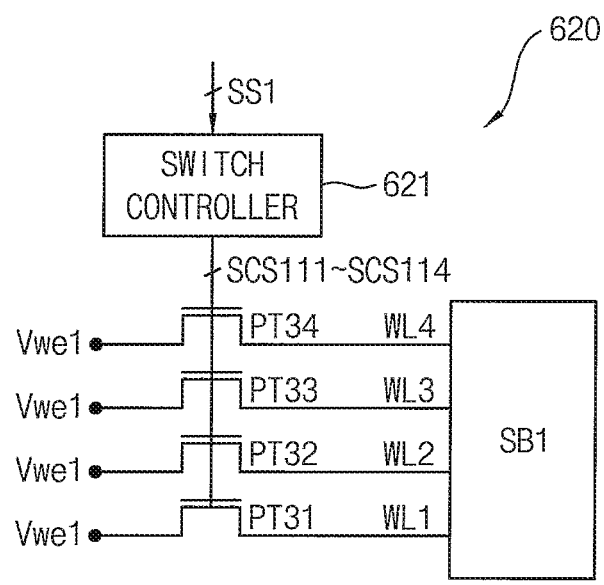

FIG. 22B illustrates an erase bias condition of the first memory block MB1 during an erase operation on the first memory block when the bad sub-block is programmed. FIG. 23A illustrates a change in voltage of the bad sub-block and a change in voltage of the substrate when the erase bias condition of FIG. 22B is employed. FIG. 23B illustrates the first switch circuit in FIG. 13 when the erase bias condition of FIG. 22B.

Referring to FIGS. 22B and 23A, the control circuit 500 controls the address decoder 600 to float the bit-line BL, the string selection line SSL and the ground selection line GSL of the cell string, controls the voltage generator 700 and the address decoder 600 to apply the first word-line erase voltage Vwe1 to the word-lines WL5~WL12. The control circuit 500 controls the voltage generator 700 and the address decoder 600 to apply the first word-line erase voltage Vwe1 to the word-lines WL1~WL4 of the bad sub-block SB1 during a first time interval INT11 during which the voltage level VSUB of the substrate 111 increases with a constant slope in response to the erase voltage VERS applied to the substrate 111. The first time interval INT11 starts from a timing point t21 at which the erase voltage VERS is applied to the substrate 111 and ends at a timing point t13 at which the voltage level VSUB of the substrate 111 reaches a voltage level of the erase voltage VERS. The address decoder 600 floats the word-lines WL1~WL4 of the bad sub-block SB1 at a time point t22 in the first time interval INT11 while the first word-line erase voltage Vwe1 is applied to the word-lines WL1~WL4 of the bad sub-block SB1.

When the word-lines WL1~WL4 of the bad sub-block SB1 are floated at the timing point t22, each voltage level of the word-lines WL1~WL4 of the bad sub-block SB1 follows the voltage level VSUB of the substrate 111. The timing point t22 may be a time point at which the voltage level VSUB reaches a reference level VREF in response to the erase voltage VERS applied to the substrate 111. The voltage level of each of the word-lines WL1~WL4 of the bad sub-block SB1 maintained as a level during a second time interval INT12. The second time interval INT12 starts from the timing point t23 and ends at a timing point t24.

Referring to FIG. 23B, each of the word-lines WL1~WL4 of the bad sub-block SB1 is coupled to each of pass transistors PT31~PT34 and each of switching control signals SCS111~SCS114 is applied to each gate of the pass transistors PT31~PT34. The switch controller 621 enables the switching control signals SCS111~SCS114 until the timing point t22 in the first time interval INT11 and disables the switching control signals SCS111 and SCS114 at the time point t22 to float word-lines WL1~WL4 of the bad sub-block SB1, in response to the first selection signal SS1.

Figure 24:
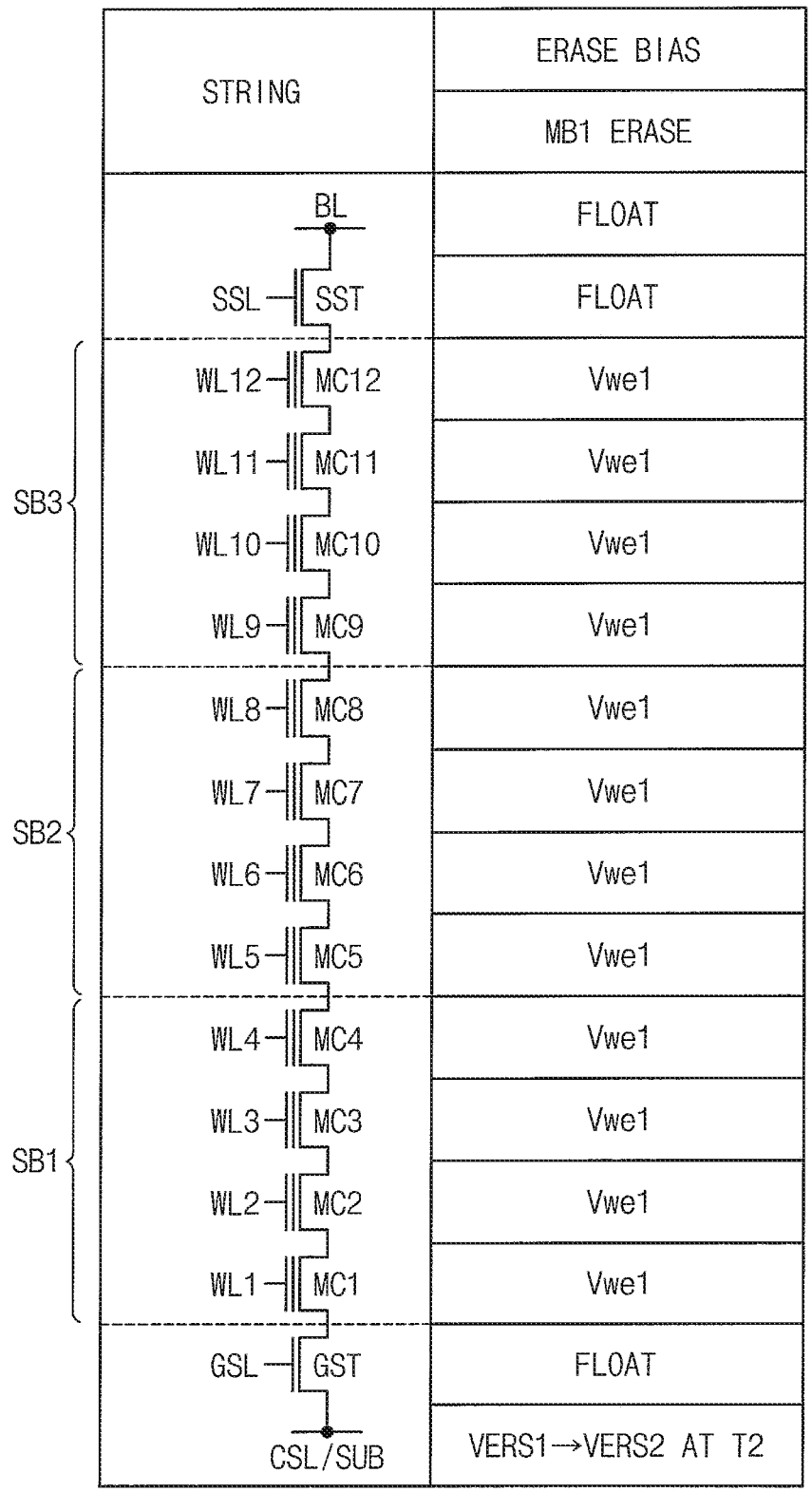
Figure 25:
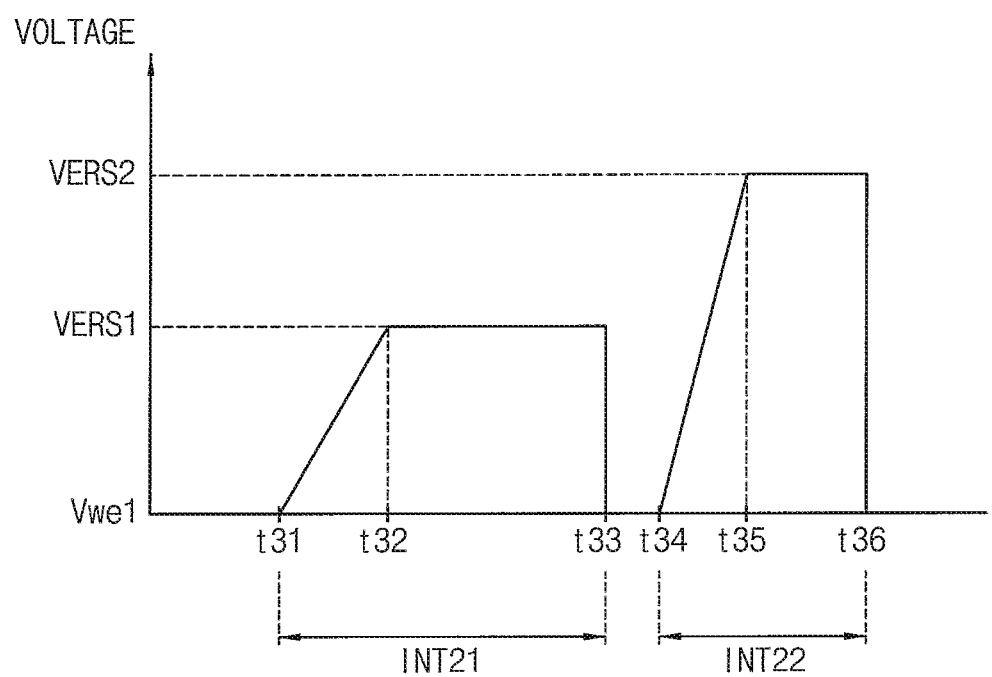

FIG. 24 illustrates an erase bias condition of the first memory block MB1 during an erase operation on the first memory block when the bad sub-block is not programmed. FIG. 25 illustrates a change in a voltage of the substrate when the erase bias condition of FIG. 24 is employed.

Referring to FIGS. 24 and 25, the control circuit 500 controls the address decoder 600 to float the bit-line BL, the string selection line SSL and the ground selection line GSL of the cell string, and controls the voltage generator 700 and the address decoder 600 to apply the first word-line erase voltage Vwe1 to the word-lines WL1~WL12 of first through third sub-blocks SB1, SB2 and SB3. The control circuit 500 controls the voltage generator 700 and the address decoder 600 to apply the erase voltage VERS to the substrate 111 from a timing point t31 and to maintain a level of the erase voltage VERS at a first level VERS1 during an interval from a timing point t32 to a timing point t33 when the erase voltage VERS reaches the first level VERS1 at the timing point t33. During a first time interval INT21, the bad sub-block SB1 is erased prior to the second and third sub-blocks SB2 and SB3. The first time interval INT21 starts at the timing point t31 and ends at the timing point t33. The control circuit 500 cuts off application of the erase voltage VERS erase voltage to the substrate 111 between timing points t33 and t34. The control circuit 500 controls the voltage generator 700 and the address decoder 600 to apply the erase voltage VERS to the substrate 111 from the timing point t34 again and to maintain a level of the erase voltage VERS at a second level VERS2 during an interval from a timing point t35 to a timing point t36 when the erase voltage VERS reaches the second level VERS2 at the timing point t35. During a second time interval INT22, the normal sub-blocks SB2 and SB3 are erased. The second time interval INT22 starts at the timing point t34 and ends at the timing point t36. Since the bad sub-block SB1 erased prior to the second and third sub-blocks SB2 and SB3, the stress of the erase voltage VERS on the bad sub-block SB1 may be reduced.

Figure 26A:
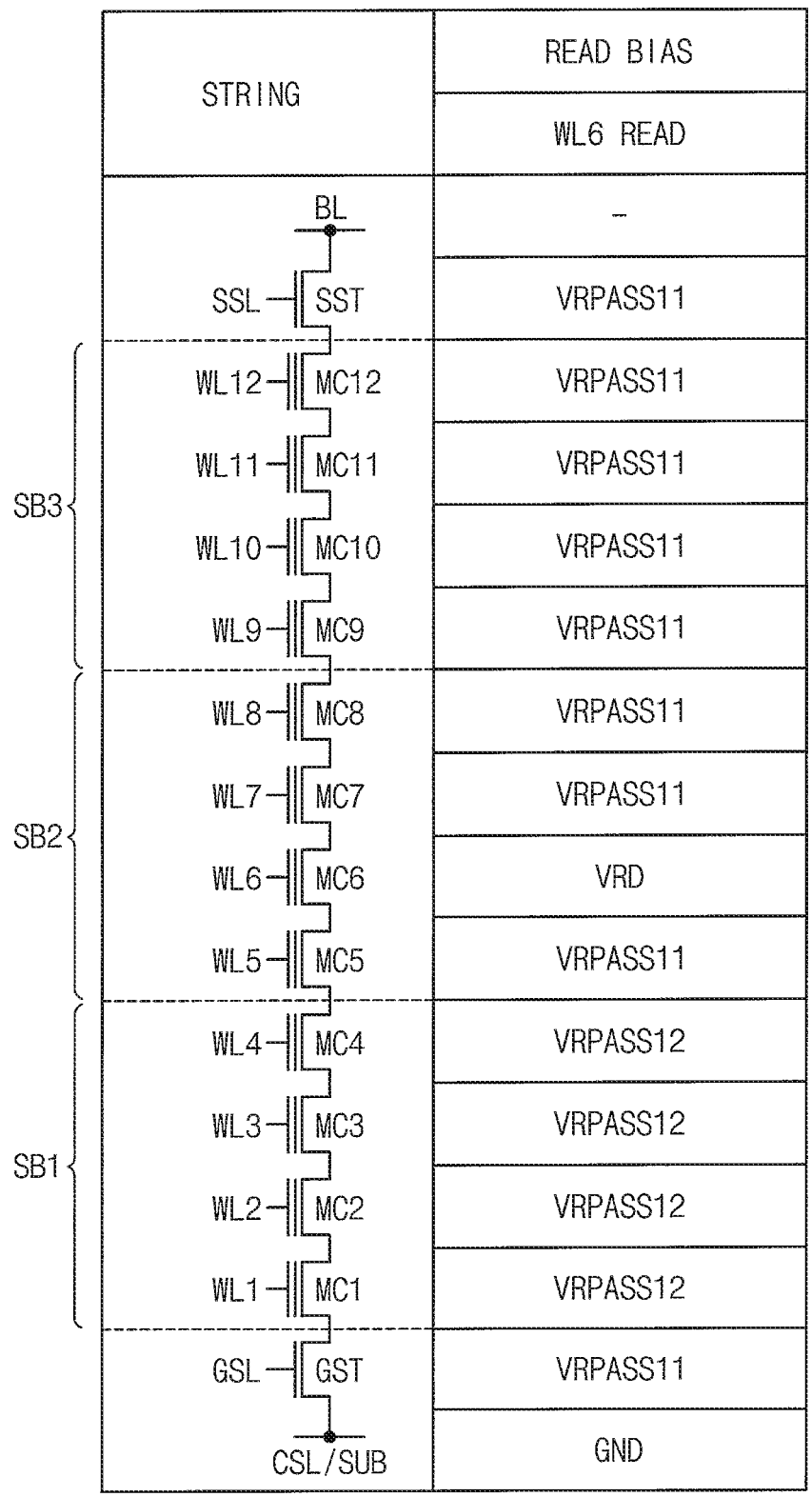

FIG. 26A illustrates a read bias condition of the first memory block during a read operation on the first memory block when the bad sub-block is not programmed.

Figure 26B:
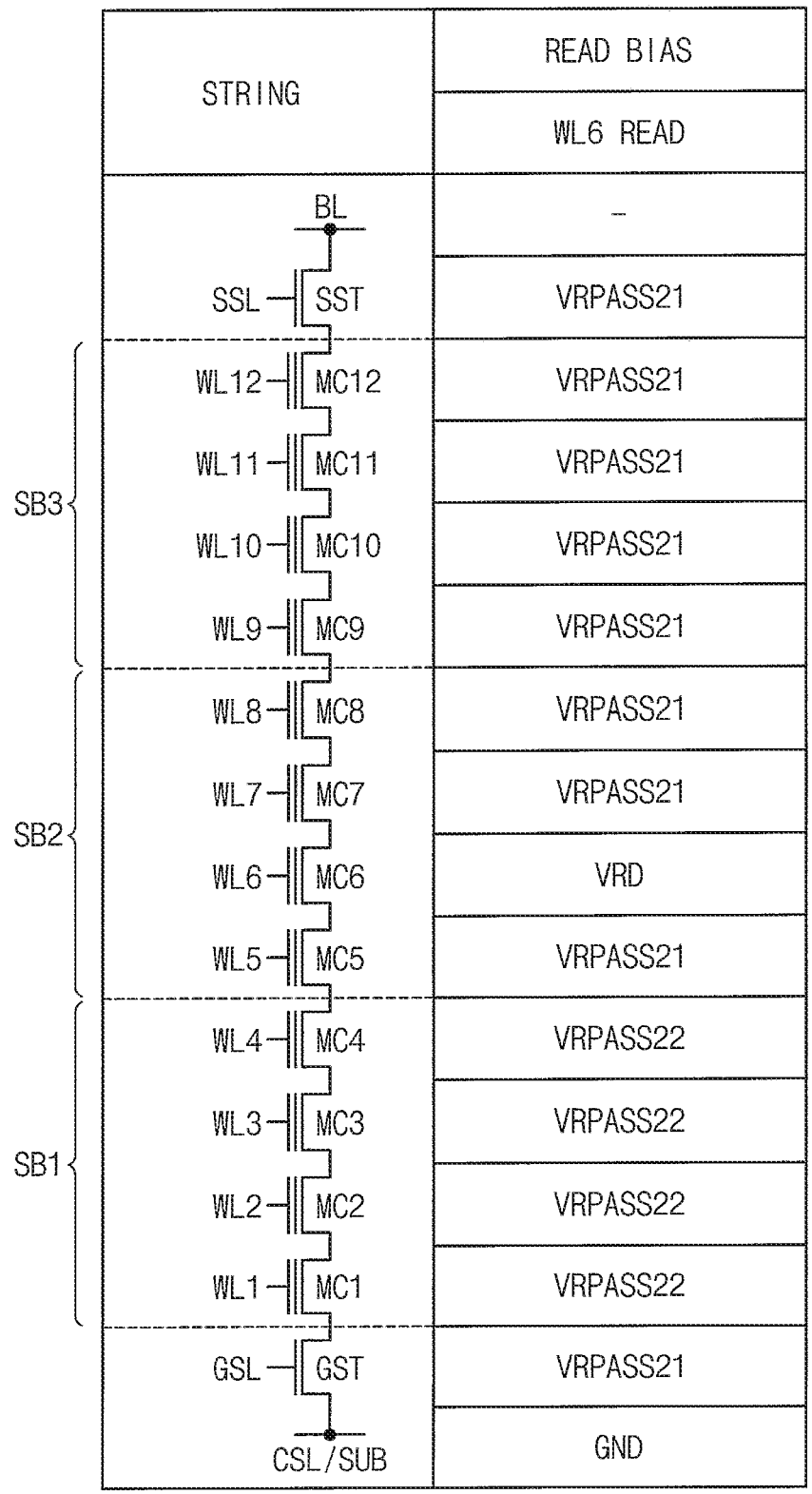

FIG. 26B illustrates a read bias condition of the first memory block during a read operation on the first memory block when the bad sub-block is programmed.

In FIGS. 26A and 26B, it is assumed that a read operation is performed on memory cells coupled to the word-line WL6 of the second sub-block (normal sub-block).

Referring to 26A, the control circuit 500 controls the voltage generator 700 and the address decoder 600 to apply a first read pass voltage VRPASS11 to the bit-line BL, the string selection line SSL, the ground selection line GSL of the cell string and the word-lines WL5 and WL7~WL12, to apply the read voltage VRD to the word-line WL6 and to apply a second read pass voltage VRPASS12 to the word-lines WL1~WL4 of the bad sub-block SB1. A level of the first read pass voltage VRPASS11 may be higher than a level of the second read pass voltage VRPASS12. Since memory cells in the bad sub-block SB1 are erased, all of the memory cells in the bad sub-block SB1 may be turned-on in response to the second read pass voltage VRPASS12.

Referring to 26B, the control circuit 500 controls the voltage generator 700 and the address decoder 600 to apply a first read pass voltage VRPASS21 to the bit-line BL, the string selection line SSL, the ground selection line GSL of the cell string and the word-lines WL5 and WL7~WL12, to apply the read voltage VRD to the word-line WL6 and to apply a second read pass voltage VRPASS22 to the word-lines WL1~WL4 of the bad sub-block SB1. A level of the first read pass voltage VRPASS21 may be equal to or higher than a level of the second read pass voltage VRPASS22. In addition, the level of the second read pass voltage VRPASS22 may be higher than the second read pass voltage VRPASS12. Since memory cells in the bad sub-block SB1 are programmed, the second read pass voltage VRPASS22 may have a level for turning-on all of the memory cells in the bad sub-block SB1.

According to some embodiments, a nonvolatile memory device may divide sub-blocks in a first memory block into at least one bad sub-block and at least one normal sub-block based on error occurrence frequency of each of the sub-blocks or based on endurance characteristic due to positions of the sub-blocks, may apply different program/erase cycles to the at least one bad sub-block and the at least one normal sub-block and may apply adjust bias condition to the first memory block during a memory operation of the first memory block. Therefore, the nonvolatile memory device may enhance performance and prevent reduction of a lifetime of the nonvolatile memory device.

Figure 27:
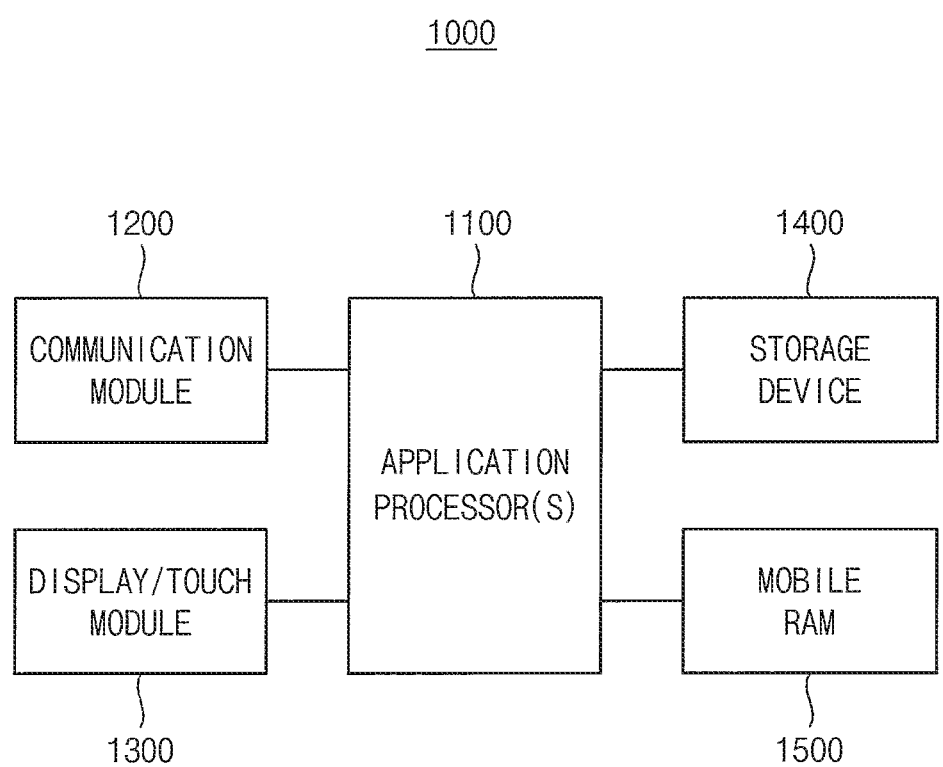
FIG. 27 is a block diagram illustrating a mobile device according to example embodiments of the present inventive concept.

FIG. 27 is a block diagram illustrating a mobile device according to example embodiments.

Referring to FIG. 27, a mobile device 1000 may include an application processor 1100, a communication module 1200, a display/touch module 1300, a storage device 1400, and a mobile RAM 1500.

The application processor 1100 controls operations of the mobile device 1000. The application processor 1100 may perform any of the operations of the flowcharts of FIGS. 16, 17, 18, and/or 20. The communication module 1200 is implemented to perform wireless or wire communications with an external device. The display/touch module 1300 is implemented to display data processed by the application processor 1100 or to receive data through a touch panel. The storage device 1400 may be implemented to store user data.

The storage device 1400 may be eMMC, SSD, UFS device, etc. The storage device 1400 may employ the storage device 30 of FIG. 2. The storage device 1400 may include a memory controller and at least one nonvolatile memory device. The at least one nonvolatile memory device may include the nonvolatile memory device 50 of FIG. 4. The mobile RAM 1500 temporarily stores data used for processing operations of the mobile device 1000.

Figure 28A:
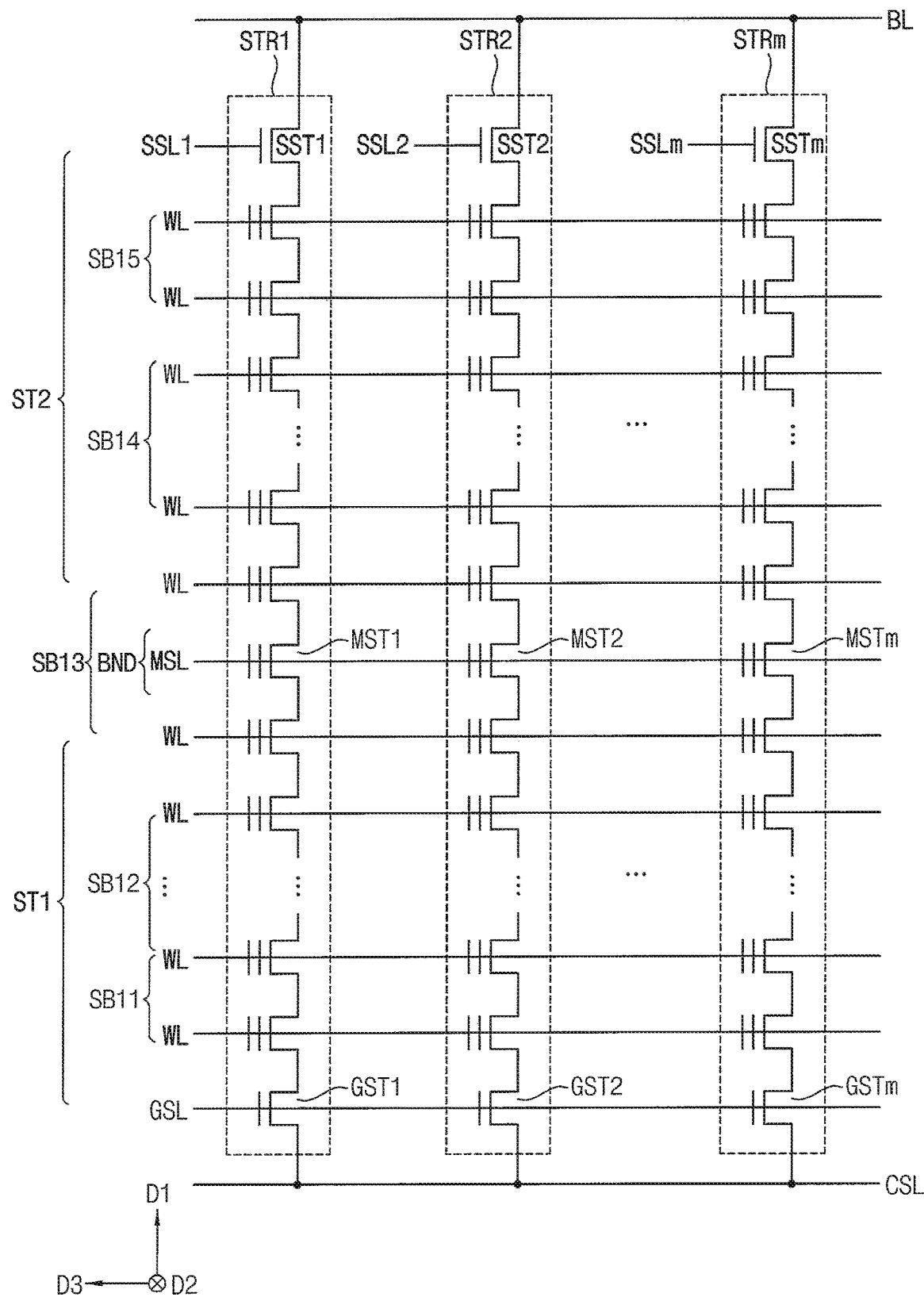
FIG. 28A is a circuit diagram illustrating a structure of a memory cell array according to example embodiments.

FIG. 28A is a circuit diagram illustrating a structure of a memory cell array according to example embodiments.

Figure 28B:
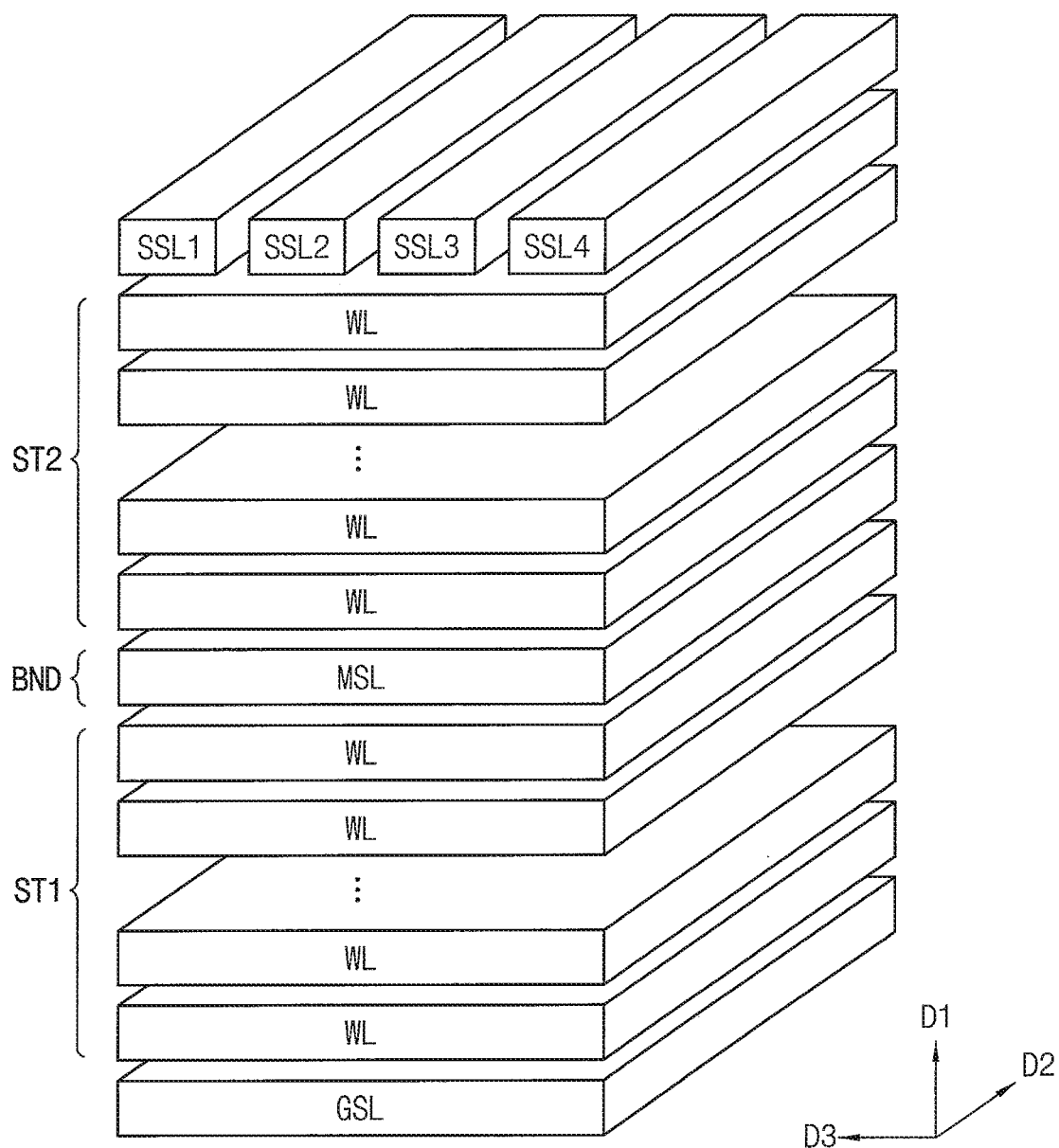
FIGS. 28B and 28C are perspective views illustrating a memory block corresponding to a structure of FIG. 28A.
Figure 28C:
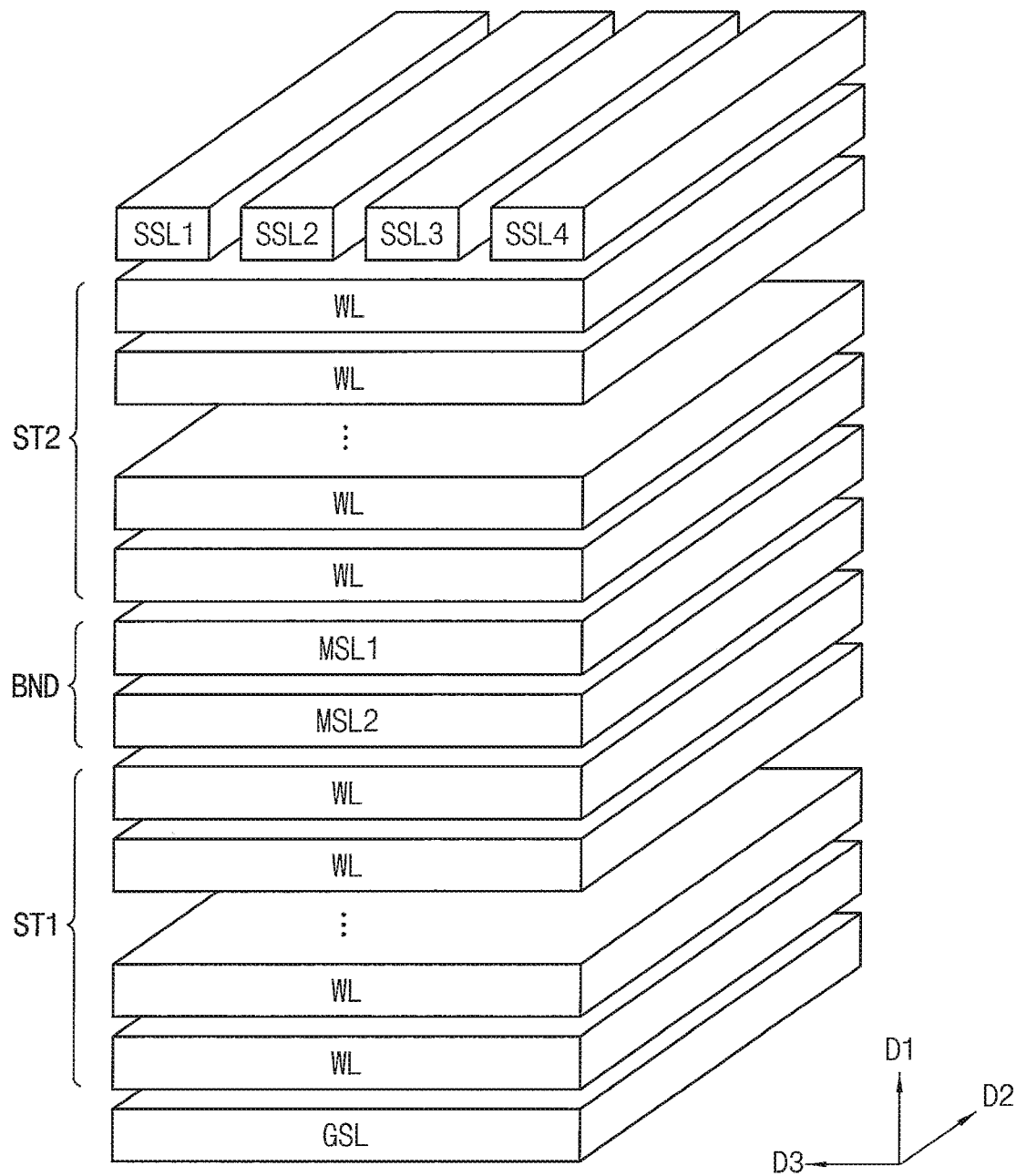

FIGS. 28B and 28C are perspective views illustrating a memory block corresponding to a structure of FIG. 28A.

FIG. 28A illustrates two-dimensional version of a memory block including cell strings connected to one bit-line BL and one source line CSL for convenience of illustration, but it will be understood that the memory block may have a three-dimensional structure of a plurality of bit-lines as described with reference to FIGS. 6 and 7.

Referring to FIGS. 28A and 28B, a memory block may include a plurality of cell strings STR1-STRm connected between a bit-line BL and a source line CSL. The cell strings STR1-STRm may include two stacks ST1 and ST2, and a boundary portion BND therebetween. The cell strings STR1-STRm may include string selection transistors SST1-SSTm controlled by string selection lines SSL1-SSLm, memory cells controlled by word-lines WL, intermediate switching transistors MST1-MSTm controlled by an intermediate switching line MSL, and ground selection transistors GST1-GSTm controlled by a ground selection line GSL, respectively. Here, m is a natural number greater than 1. The intermediate switching line MSL may be a dummy word-line, and the intermediate switching transistors MST1-MSTm may be dummy transistors which are not connected to the bit-lines BL. The memory cells connected to word-lines disposed in end portions of the stacks ST1 and ST2 in the first direction D1 may be dummy cells.

The memory block may be divided into a plurality of sub-blocks SB11, SB12, SB13, SB14 and SB15. The sub-blocks SB11 and SB12 may include memory cells coupled to word-lines in the stack ST1, the sub-blocks SB14 and SB15 may include memory cells coupled to word-lines in in the stack ST2, and the sub-block SB13 may include memory cells coupled to word-lines to the boundary portion BND including the intermediate switching line MSL. The sub-block SB13 may be referred to as an intermediate sub-block. The sub-blocks SB11 and SB12 may be identified as a first group and the sub-blocks SB14 and SB15 may be identified as a second group.

FIG. 28A illustrates an embodiment that the ground selection transistors GST1-GSTm are connected to the same ground selection line GSL. In other embodiments, the ground selection transistors may be connected to the respective ground selection lines.

In some embodiments, as illustrated in FIGS. 28A and 28B, the boundary portion BND may include one gate line MSL that switches or activates simultaneously the intermediate switching transistors MST1-MSTm connected thereto. In other embodiments, as illustrated in FIG. 28C, the boundary portion BND may include two gate lines MSL1 and MSL2 that switch simultaneously the intermediate switching transistors connected thereto. Even though not illustrated in figures, the boundary portion BND may include three or more gate lines.

Figure 29:
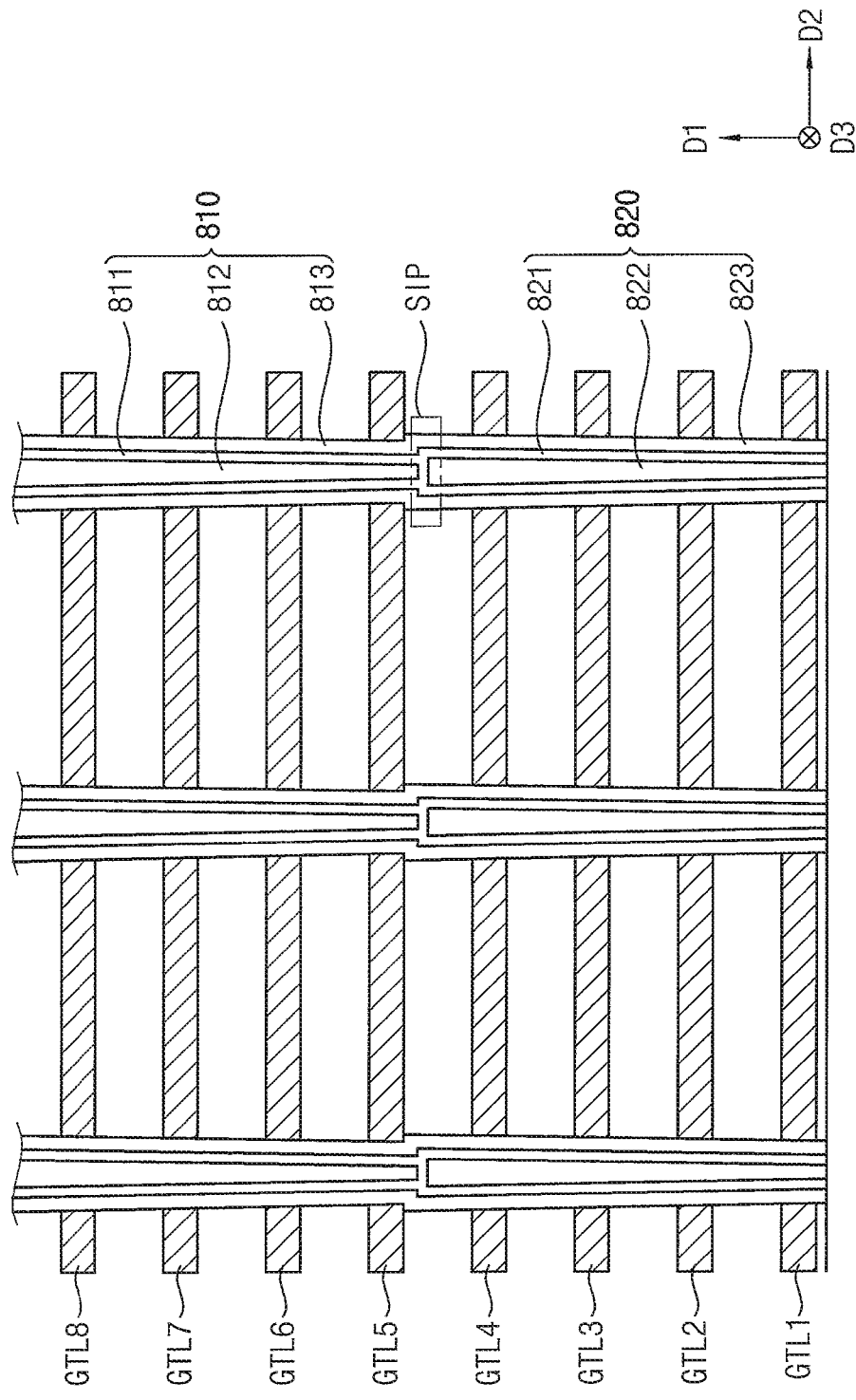
FIG. 29 is a cross-sectional view for describing an embodiment of a boundary portion included in a memory block according to example embodiments.

FIG. 29 is a cross-sectional view for describing an embodiment of a boundary portion included in a memory block according to example embodiments.

Referring to FIG. 29, a channel hole of each cell string STR may include a first sub channel hole 820 and a second sub channel hole 810. A channel hole may be referred to as a pillar corresponding to the pillar 313 shown in FIG. 6. The first sub channel hole 820 may include a channel layer 821, an inner material 822 and an insulation layer 823. The second sub channel hole 810 may include a channel layer 811, an inner material 812 and an insulation layer 813. The channel layer 821 of the first channel hole 820 may be connected to the channel layer 811 of the second sub channel hole 810 through a P-type silicon pad SIP. The sub channel holes 820 and 810 may be formed using a stopper line GTL5 having an appropriate etch rate. For example, the stopper line GTL5 may be formed of polysilicon and the other gate lines GTL1-GTL4 and the GTL6-GTL8 may be formed of a metal such as tungsten to implement the appropriate etch rate.

The above-described boundary portion BND may correspond to the stopper layer GTL5 that is used to form the plurality of sub channel holes. The cells in the stopper layer GTL5 may be improper for storing data, and the stopper layer may be used as the boundary portion BND to from the intermediate switching transistors. Embodiments are not limited to a boundary portion of one stopper layer, and the boundary portion may include two or more gate layers.

The control circuit 500 in FIG. 4 or the memory controller 40 in FIG. 2 may identify the sub-blocks SB11, SB12, SB13, SB14 and SB15 as at least one bad sub-block and at least one normal sub-block based on error occurrence frequency of each of the sub-blocks SB11, SB12, SB13, SB14 and SB15. For example, the control circuit 500 in FIG. 4 or the memory controller 40 in FIG. 2 may identify the sub-blocks SB11, SB12, SB14 and SB15 as a normal sub-block and may identify the sub-block SB13 as a bad sub-block.

For example, the control circuit 500 in FIG. 4 or the memory controller 40 in FIG. 2 may apply respective program/erase cycles of respective durations to the first group, the second group and the intermediate sub-block SB13 based on an address. For example, the control circuit 500 in FIG. 4 or the memory controller 40 in FIG. 2 may apply a first program/erase cycle to the sub-blocks SB11 and SB12 in the stack ST1 during a first time interval, may apply a second program/erase cycle to the sub-blocks SB14 and SB15 in the stack ST2 during a second time interval and may apply a third program/erase cycle to the sub-block SB13 during a third time interval. The second time interval is less than the first time interval and the third time interval is less than the second time interval.

For example, the control circuit 500 in FIG. 4 or the memory controller 40 in FIG. 2 may apply a first program/erase cycle to the sub-block SB11 and may apply a second program/erase cycle to the sub-block SB12 based on closeness to the intermediate sub-block SB13. The second time interval is less than the first time interval.

Figure 30:
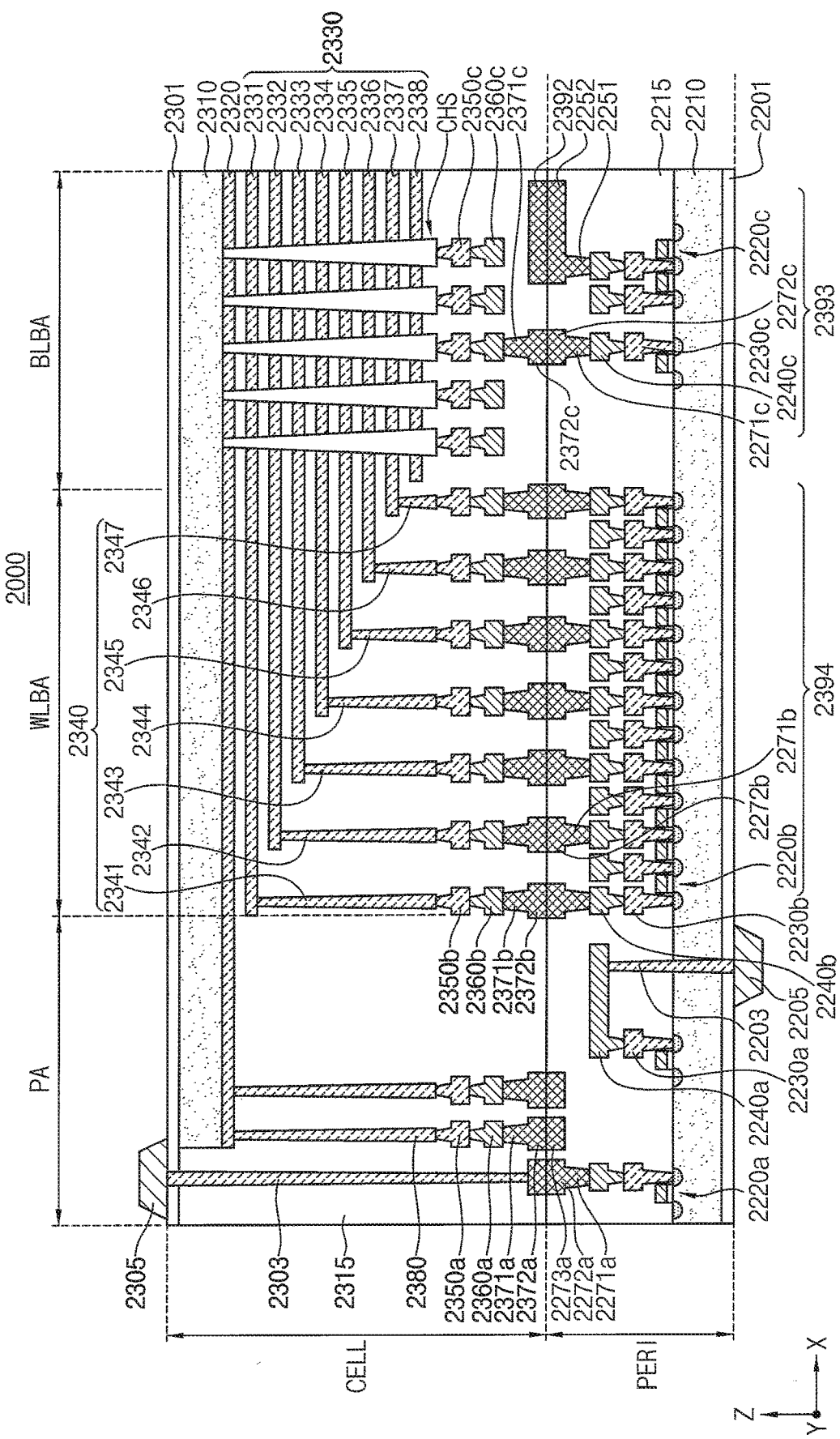
FIG. 30 is a cross-sectional view illustrating a nonvolatile memory device according to example embodiments.

FIG. 30 is a cross-sectional view illustrating a nonvolatile memory device according to example embodiments.

Referring to FIG. 30, a nonvolatile memory device 2000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, the bonding metals may include copper (Cu) using a Cu-to-Cu bonding. The example embodiment, however, may not be limited thereto. For example, the bonding metals may also be formed of aluminum (Al) or tungsten (W).

Each of the peripheral circuit region PERI and the cell region CELL of the nonvolatile memory device 2000 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. Each of the circuit elements 2220a, 2220b, and 2220c may include one or more transistors. In an example embodiment, the first metal layers 2230a, 2230b, and 2230c may be formed of tungsten having relatively high electrical resistance, and the second metal layers 2240a, 2240b, and 2240c may be formed of copper having relatively low electrical resistance.

In an example embodiment illustrate in FIG. 30, although only the first metal layers 2230a, 2230b, and 2230c and the second metal layers 2240a, 2240b, and 2240c are shown and described, the example embodiments is not limited thereto, and one or more additional metal layers may be further formed on the second metal layers 2240a, 2240b, and 2240c. At least a portion of the one or more metal layers formed on the second metal layers 2240a, 2240b, and 2240c may be formed of aluminum or the like having a lower electrical resistance than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, or the like.

The cell region CELL may include at least one memory block. The cell region CELL may include a second substrate 2310 and a common source line 2320. On the second substrate 2310, a plurality of word lines 2331 to 2338 (i.e., 2330) may be stacked in a direction (a Z-axis direction), perpendicular to an upper surface of the second substrate 2310. At least one string select line and at least one ground select line may be arranged on and below the plurality of word lines 2330, respectively, and the plurality of word lines 2330 may be disposed between the at least one string select line and the at least one ground select line. The at least one memory block in the cell region may be divided into a plurality of sub-blocks.

In the bit-line bonding area BLBA, a channel structure CHS may extend in a direction (a Z-axis direction), perpendicular to the upper surface of the second substrate 2310, and pass through the plurality of word lines 2330, the at least one string select line, and the at least one ground select line. The channel structure CHS may include a data storage layer, a channel layer, a buried insulating layer, and the like, and the channel layer may be electrically connected to a third metal layer 2350c and a fourth metal layer 2360c. For example, the third metal layer 2350c may be a bit-line contact, and the fourth metal layer 2360c may be a bit-line. In an example embodiment, the bit line 2360c may extend in a first direction (a Y-axis direction), parallel to the upper surface of the second substrate 2310.

In an example embodiment illustrated in FIG. 30, an area in which the channel structure CHS, the bit line 2360c, and the like are disposed may be defined as the bit line bonding area BLBA. In the bit line bonding area BLBA, the bit line 2360c may be electrically connected to the circuit elements 2220c providing a page buffer circuit 2393 in the peripheral circuit region PERI. The bit line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer circuit 2393.

In the word line bonding area WLBA, the plurality of word lines 2330 may extend in a second direction (an X-axis direction), parallel to the upper surface of the second substrate 2310 and perpendicular to the first direction, and may be connected to a plurality of cell contact plugs 2341 to 2347 (i.e., 2340). The plurality of word lines 2330 and the plurality of cell contact plugs 2340 may be connected to each other respectively in pads provided by at least a portion of the plurality of word lines 2330 extending in different lengths in the second direction. A third metal layer 2350b and a fourth metal layer 2360b may be connected to an upper portion of the plurality of cell contact plugs 2340 connected to the plurality of word lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word line bonding area WLBA.

The plurality of cell contact plugs 2340 may be electrically connected to the circuit elements 2220b forming a row decoder 2394 in the peripheral circuit region PERI. In an example embodiment, operating voltages of the circuit elements 2220b of the row decoder 2394 may be different than operating voltages of the circuit elements 2220c forming the page buffer circuit 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A third metal layer 2350a and a fourth metal layer 2360a may be stacked on an upper portion of the common source line contact plug 2380, sequentially. For example, an area in which the common source line contact plug 2380, the third metal layer 2350a, and the fourth metal layer 2360a are disposed may be defined as the external pad bonding area PA.

Input-output pads 2205 and 2305 may be disposed in the external pad bonding area PA. Referring to FIG. 28, a lower insulating film 2201 covering or overlapping a lower surface of the first substrate 2210 may be formed below the first substrate 2210, and a first input-output pad 2205 may be formed on the lower insulating film 2201. The first input-output pad 2205 may be connected to at least one of the plurality of circuit elements 2220a, 2220b, and 2220c disposed in the peripheral circuit region PERI through a first input-output contact plug 2203, and the first input-output pad 2205 may be separated from the first substrate 2210 by the lower insulating film 2201. In addition, a side insulating film may be disposed between the first input-output contact plug 2203 and the first substrate 2210 to electrically separate the first input-output contact plug 2203 and the first substrate 2210.

Referring to FIG. 30, an upper insulating film 2301 covering or overlapping the upper surface of the second substrate 2310 may be formed on the second substrate 2310, and a second input-output pad 2305 may be disposed on the upper insulating layer 2301. The second input-output pad 2305 may be connected to at least one of the plurality of circuit elements 2220a, 2220b, and 2220c disposed in the peripheral circuit region PERI through a second input-output contact plug 2303. In the example embodiment, the second input-output pad 2305 is electrically connected to a circuit element 2220a.

According to some embodiments, the second substrate 2310 and the common source line 2320 may not be disposed in an area in which the second input-output contact plug 2303 is disposed. Also, the second input-output pad 2305 may not overlap the word lines 2330 in the direction (the Z-axis direction). Referring to FIG. 30, the second input-output contact plug 2303 may be separated from the second substrate 2310 in a direction, parallel to the upper surface of the second substrate 2310, and may pass through an interlayer insulating layer 2315 of the cell region CELL to be connected to the second input-output pad 2305.

According to some embodiments, the first input-output pad 2205 and the second input-output pad 2305 may be selectively formed. For example, the nonvolatile memory device 2000 may include only the first input-output pad 2205 disposed on the lower insulating film 2201 in contact with the first substrate 2210 or the second input-output pad 2305 disposed on the upper insulating film 2301 in contact with the second substrate 2310. Alternatively, the nonvolatile memory device 2000 may include both the first input-output pad 2205 and the second input-output pad 2305.

A metal pattern provided in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the nonvolatile memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 227 formed in an uppermost metal layer of the peripheral circuit region PERI, and having the same shape as a lower metal pattern of the peripheral circuit region PERI, may be formed in an uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371b and 2372b of the cell region CELL by a Cu—Cu bonding.

Further, in the bit line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

According to an example embodiment of the inventive concept, an address decoder in the peripheral circuit region PERI may apply erase voltage to each of the sub-blocks through the lower bonding metals 2271b and 2272b and the upper bonding metals 2371b and 2372b by unit of sub-block. The erase voltage may be separated and provided to each of the sub-blocks by the metal layers 2350b and 2360b in the cell region CELL.

A nonvolatile memory device or a storage device according to some embodiments may be packaged using various package types or package configurations.

The present disclosure may be applied to various electronic devices including a nonvolatile memory device. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of some embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A nonvolatile memory device comprising:
a memory block comprising at least a first stack and a second stack in a vertical direction, the memory block comprising a plurality of cell strings, each cell string comprising a plurality of memory cells connected in series in the vertical direction between a source line and each of a plurality of bit-lines, wherein some memory cells of the plurality of memory cells are selectable by a sub-block unit smaller than the memory block;
a plurality of intermediate switching transistors coupled to an intermediate gate line and in a boundary portion between the first stack and the second stack in the vertical direction, sub-blocks of the memory block comprising a first group comprising a first sub-block and a second sub-block including memory cells coupled to word-lines in the first stack, a second group comprising a third sub-block and a fourth sub-block including memory cells coupled to word-lines in the second stack and an intermediate sub-block comprising memory cells coupled to word-lines adjacent to the intermediate gate line; and
a control circuit configured to apply respective program/erase cycles of different respective durations to the first group, the second group, and the intermediate sub-block based on an address.

2. The nonvolatile memory device of claim 1, wherein the control circuit is configured to:
apply a first program/erase cycle of a first duration to the first group when the address designates the first group;
apply a second program/erase cycle of a second duration to the second group when the address designates the second group; and
apply a third program/erase cycle of a third duration to the intermediate sub-block when the address designates the intermediate sub-block,
wherein the first duration, the second duration and the third duration are different from one another.

3. The nonvolatile memory device of claim 2,
wherein the first duration runs in a first time interval, the second duration runs in a second time interval and the third duration runs in a third time interval, and
wherein the second time interval is less than the first time interval and the third time interval is less than the second time interval.

4. The nonvolatile memory device of claim 1,
wherein the second sub-block is closer to the intermediate sub-block than the first sub-block
wherein the control circuit is configured to apply a first program/erase cycle of a first duration to the first sub-block when the address designates the first sub-block, and apply a second program/erase cycle of a second duration to the second sub-block when the address designates the second sub-block,
wherein the first duration runs in a first time interval, and the second duration runs in a second time interval, and
wherein the second time interval is less than the first time interval.

5. The nonvolatile memory device of claim 1,
wherein the third sub-block is closer to the intermediate sub-block than the fourth sub-block,
wherein the control circuit is configured to apply a first program/erase cycle of a first duration to the fourth sub-block when the address designates the fourth sub-block, and apply a second program/erase cycle of a second duration to the third sub-block when the address designates the third sub-block,
wherein the first duration runs in a first time interval, and the second duration runs in a second time interval, and
wherein the second time interval is less than the first time interval.

6. The nonvolatile memory device of claim 1, wherein the control circuit is configured to:
apply a first program/erase cycle of a first duration to one of sub-blocks in the first group and the second group when the address designates one of the sub-blocks in the first group and the second group; and
apply a second program/erase cycle of a second duration to the intermediate sub-block when the address designates the intermediate sub-block,
wherein the first duration and the second duration are different from each other.

7. The nonvolatile memory device of claim 6,
wherein the first duration runs in a first time interval and the second duration runs in a second time interval, and wherein the second time interval is less than the first time interval.

8. A memory system comprising:
a nonvolatile memory device; and
a memory controller configured to control the nonvolatile memory device,
wherein the nonvolatile memory device comprises: a memory cell array comprising a plurality of memory blocks, a first memory block of the plurality of memory blocks comprising at least a first stack and a second stack in a vertical direction, the first memory block comprising a plurality of cell strings, each cell string comprising a plurality of memory cells connected in series in the vertical direction between a source line and each of a plurality of bit-lines, wherein some memory cells of the plurality of memory cells are selectable by a sub-block unit smaller than one memory block of the plurality of memory blocks; and
a plurality of intermediate switching transistors coupled to an intermediate gate line and in a boundary portion between the first stack and the second stack in the vertical direction, sub-blocks of the first memory block comprising a first group comprising a first sub-block and a second sub-block including memory cells coupled to word-lines in the first stack, a second group comprising a third sub-block and a fourth sub-block including memory cells coupled to word-lines in the second stack, and an intermediate sub-block comprising memory cells coupled to word-lines adjacent to the intermediate gate line,
wherein the memory controller is configured to apply respective program/erase cycles of different respective durations to the first group, the second group and the intermediate sub-block using a command and address to be applied to the nonvolatile memory device.

9. The memory system of claim 8, wherein the memory controller is configured to:
apply a first program/erase cycle of a first duration to the first group when the address designates the first group;
apply a second program/erase cycle of a second duration to the second group when the address designates the second group; and
apply a third program/erase cycle of a third duration to the intermediate sub-block when the address designates the intermediate sub-block,
wherein the first duration, the second duration and the third duration are different from one another.

10. The memory system of claim 9,
wherein the first duration runs in a first time interval, the second duration runs in a second time interval and the third duration runs in a third time interval, and
wherein the second time interval is less than the first time interval and the third time interval is less than the second time interval.

11. The memory system of claim 8,
wherein the second sub-block is closer to the intermediate sub-block than the first sub-block,
wherein the memory controller is configured to apply a first program/erase cycle of a first duration to the first sub-block when the address designates the first sub-block, and apply a second program/erase cycle of a second duration to the second sub-block when the address designates the second sub-block,
wherein the first duration runs in a first time interval, and the second duration runs in a second time interval, and
wherein the second time interval is less than the first time interval.

12. The memory system of claim 8, wherein the memory controller is configured to:
apply a first program/erase cycle of a first duration to one of sub-blocks in the first group and the second group when the address designates one of the sub-blocks in the first group and the second group; and
apply a second program/erase cycle of a second duration to the intermediate sub-block when the address designates the intermediate sub-block,
wherein the first duration runs in a first time interval, and the second duration runs in a second time interval, and
wherein the second time interval is less than the first time interval.

* * * * *